(12) United States Patent
Ono et al.

(10) Patent No.: US 7,613,010 B2
(45) Date of Patent: Nov. 3, 2009

(54) STEREOSCOPIC ELECTRONIC CIRCUIT DEVICE, AND RELAY BOARD AND RELAY FRAME USED THEREIN

(75) Inventors: Masahiro Ono, Sakai (JP); Shigeru Kondo, Neyagawa (JP); Kazuhiro Nishikawa, Mishima-gun (JP); Yoshihiko Yagi, Ashiya (JP); Kazuto Nishida, Katano (JP)

(73) Assignee: Panasonic Corporation, Osaka (JP)

( * ) Notice: Subject to any disclaimer, the term of this patent is extended or adjusted under 35 U.S.C. 154(b) by 921 days.

(21) Appl. No.: 10/985,325

(22) Filed: Nov. 10, 2004

(65) Prior Publication Data

US 2005/0168961 A1    Aug. 4, 2005

(30) Foreign Application Priority Data

Feb. 2, 2004    (JP)    ............................. 2004-025238
Mar. 3, 2004    (JP)    ............................. 2004-058436

(51) Int. Cl.
*H05K 1/11*    (2006.01)
(52) U.S. Cl. .................................................... 361/784
(58) Field of Classification Search ................. 361/784, 361/790
See application file for complete search history.

(56) References Cited

U.S. PATENT DOCUMENTS

| | | | | |
|---|---|---|---|---|
| 4,661,792 A | * | 4/1987 | Watkins ......................... | 336/65 |
| 5,440,454 A | * | 8/1995 | Hashimoto et al. ........... | 361/790 |
| 5,570,274 A | | 10/1996 | Saito et al. | |
| 6,137,163 A | * | 10/2000 | Kim et al. .................... | 257/686 |
| 6,291,892 B1 | * | 9/2001 | Yamaguchi .................. | 257/778 |
| 6,297,551 B1 | * | 10/2001 | Dudderar et al. ............ | 257/723 |
| 2002/0055283 A1 | | 5/2002 | Yoon et al. | |

FOREIGN PATENT DOCUMENTS

| | | |
|---|---|---|
| DE | 102 27 305 A1 | 9/2003 |
| JP | 04-304693 | 10/1992 |
| JP | 05-029784 | 2/1993 |
| JP | 06-181375 | 6/1994 |
| JP | 6-181375 | 6/1994 |
| JP | 06-260736 A | 9/1994 |
| JP | 07-030215 | 1/1995 |
| JP | 07-153903 | 6/1995 |
| JP | 11-067963 | 3/1999 |
| JP | 11-67963 | 3/1999 |
| JP | 11-097583 | 4/1999 |
| JP | 11-163197 | 6/1999 |
| JP | 11-289024 | 10/1999 |
| JP | 2001-135775 A | 5/2001 |
| JP | 2001-177235 A | 6/2001 |
| JP | 2001-267715 A | 9/2001 |
| JP | 2002-198108 A | 7/2002 |

* cited by examiner

*Primary Examiner*—Dean A. Reichard
*Assistant Examiner*—Abiy Getachew
(74) *Attorney, Agent, or Firm*—RatnerPrestia

(57) ABSTRACT

A stereoscopically connected structure is made up of a first circuit board and a second circuit board which are mounted with other electronic components, and a relay board having a recess which is mounted with an electronic component and is provided with a lead-out wiring extending from the electronic component, and also having a land part to be connected with the lead-out wiring on one of the surfaces of the relay board that face the first circuit board and second circuit board. Thus the relay board can mount the electronic component thereon as well as connect the first circuit board and the second circuit board, thereby achieving high density mounting.

25 Claims, 31 Drawing Sheets

STEREOSCOPIC ELECTRONIC CIRCUIT DEVICE, AND RELAY BOARD AND RELAY FRAME USED THEREIN

BACKGROUND OF THE INVENTION

1. Field of the Invention

The present invention relates to a stereoscopic electronic circuit device in which circuit boards mounted with electronic components are connected stereoscopically with each other by using a relay board or the like, and also relates to a shield structure thereof.

2. Background Art

In recent years, as electronic devices have been reduced in size and weight, there has been a strong demand for improving mounting density in electronic circuit devices having resistors, capacitors, semiconductor elements and the like mounted on an insulating circuit board. In addition, as electronic devices have been operated at higher speed and frequency, there have been rigorous demands for satisfying the criteria of EMC (Electromagnetic Compatibility) which indicates the ability to avoid malfunction due to external electromagnetic waves or not to interfere with the operation of other electronic devices.

Conventionally, in electronic circuit devices of this kind, high-density component mounting has been achieved by reducing the interconnection pitch to a micro level or stacking a plurality of electronic circuit boards.

FIG. 30 shows an electronic circuit device, which is disclosed in Japanese Patent Laid-Open Application No. 2001-177235 (hereinafter referred to as patent document 1).

In this device, spacer 1360, which is temporarily fixed with solder balls 1380 and 1390 conducting between the top and bottom surfaces of spacer 1360 through via holes 1320, is temporarily fixed between base printed board 1310 and module circuit board 1350. Then, batch reflow soldering is performed to stack module circuit board 1350 mounted with surface mounting component 1330, semiconductor bare chip 1340 and other components onto base printed board 1310 with spacer 1360 disposed therebetween.

FIG. 31 shows another electronic circuit device, which is disclosed in Japanese Patent Laid-Open Application No. 2001-267715 (hereinafter referred to as patent document 2). In this device, heat-resistant elastic member 1400 whose outer surface is coated with conductive material is soldered to connecting land 1420 of one electronic circuit board 1410 and is bonded with pressure to connecting land 1440 of the other electronic circuit board 1430 by clips, bolts or the like. Thus, electronic circuit boards 1410 and 1430 each mounted with surface mounting component 1450, semiconductor bare chip 1460 and the like are vertically stacked.

FIG. 32 shows further another electronic circuit device, which is disclosed in Japanese Patent Laid-Open Application No. H06-260736 (hereinafter referred to as patent document 3). In this device, an IC module, which is composed of module circuit board 1500 mounted with IC package 1510 and passive components 1520 and 1530, is connected mechanically and electrically to mother board 1540 with connecting chip 1550 disposed therebetween.

In addition to the aforementioned structures, board bonding can also be achieved by using connectors which are general connecting components.

However, while electronic devices are becoming higher performing and miniaturized, there is a limit to improving mounting density in two-dimensional electronic circuit devices only by reducing the interconnection pitch to a micro level or decreasing the spacing between adjacent components.

Therefore, high-density mounting is being achieved by stacking module circuit boards three dimensionally. For example, spacer 1360 of patent document 1 and connecting chip 1550 of patent document 3 connect a land formed on the top surface of a glass epoxy circuit board with the corresponding land formed on the bottom surface of the other glass epoxy circuit board three-dimensionally through via holes 1320. However, spacer 1360 and connecting chip 1550 are used only to connect module circuit boards opposed to each other electrically and mechanically, and are not mounted with any electronic components such as semiconductor elements thereon.

In a case where clips or bolts are used to fix the module circuit boards stacked as in patent document 2, the area allowed for the mounting decreases with increasing area occupied for the provision of the fixing and connecting members.

In addition, an increase in the number of connecting terminals between the module circuit boards increases the area taken up for the connecting connectors in the connection of the module circuit boards.

Thus the increase in the area for the connection between the module circuit boards prevents an improvement in mounting density.

Furthermore, in order to improve EMC properties, Japanese Patent Laid-Open Application No. H05-29784 (hereinafter referred to as patent document 4) uses a metal case, whereas Japanese Patent Laid-Open Application No. H07-30215 (hereinafter referred to as patent document 5) uses a metal board subjected to an insulating treatment, thereby shielding module circuit boards from electromagnetic waves or the like.

However, such shielding with a metal case or an insulating metal board for EMC measurements in line with high-speed and high-frequency electronic devices has the following problems.

In patent document 4, the metal case is an additional part for shielding electromagnetic waves and causes an increase in the weight and volume of electronic devices, going against the trend toward miniaturization. In addition, high-density component mounting requires the metal case undergoing an insulating treatment, similar to the metal board.

In patent document 5, the insulating metal board subjected to the insulating treatment leads to an increase in the weight and volume of electronic devices, similar to the metal case of patent document 4. In addition, it is impossible to completely shield the radiation of unnecessary electromagnetic waves or the intrusion of external noise through the gaps of the corner posts because these are where the top and bottom insulating metal boards are connected with each other.

SUMMARY OF THE INVENTION

The stereoscopic electronic circuit device of the present invention may be made up of a first circuit board, a second circuit board and a relay board having recesses which are each mounted with an electronic component and are each provided with a lead-out wiring extending from the electronic component, and also having land parts for connecting between the lead-out wirings and the first circuit board and the second circuit board on the surfaces of the relay board that face the first circuit board and second circuit board. The first circuit board and the second circuit board are connected with each other three-dimensionally via land parts of the relay board.

The stereoscopic electronic circuit device of the present invention may also be made up of a first circuit board, a second circuit board and a relay frame having side surfaces which are each mounted with an electronic component and are each provided with a lead-out wiring extending from the electronic component, and also having land parts for connecting between the lead-out wirings and the first circuit board and the second circuit board on the surfaces of the relay board that face the first circuit board and second circuit board. The first circuit board and the second circuit board are connected with each other three-dimensionally via land parts of the relay frame.

The relay board of the present invention has a recess which is mounted with an electronic component and is provided with a lead-out wiring extending from the electronic component, and also has a land part connected with a lead-out wiring to be connected with an other circuit board on the surface of the relay board that faces the other circuit board.

The relay frame of the present invention has at least one side surface that is mounted with an electronic component and is provided with a lead-out wiring extending from the electronic component, and also has a land part connected with a lead-out wiring to be connected with an other circuit board on the surface of the relay board that faces the other circuit board.

DETAILED DESCRIPTION OF THE INVENTION

The following is a description of embodiments of the present invention with reference to accompanying drawings. Equivalent components will be referred to with the same marks and will not be repeatedly described in detail. Each component is exaggerated for purposes of illustration.

First Embodiment

Figure 1A:
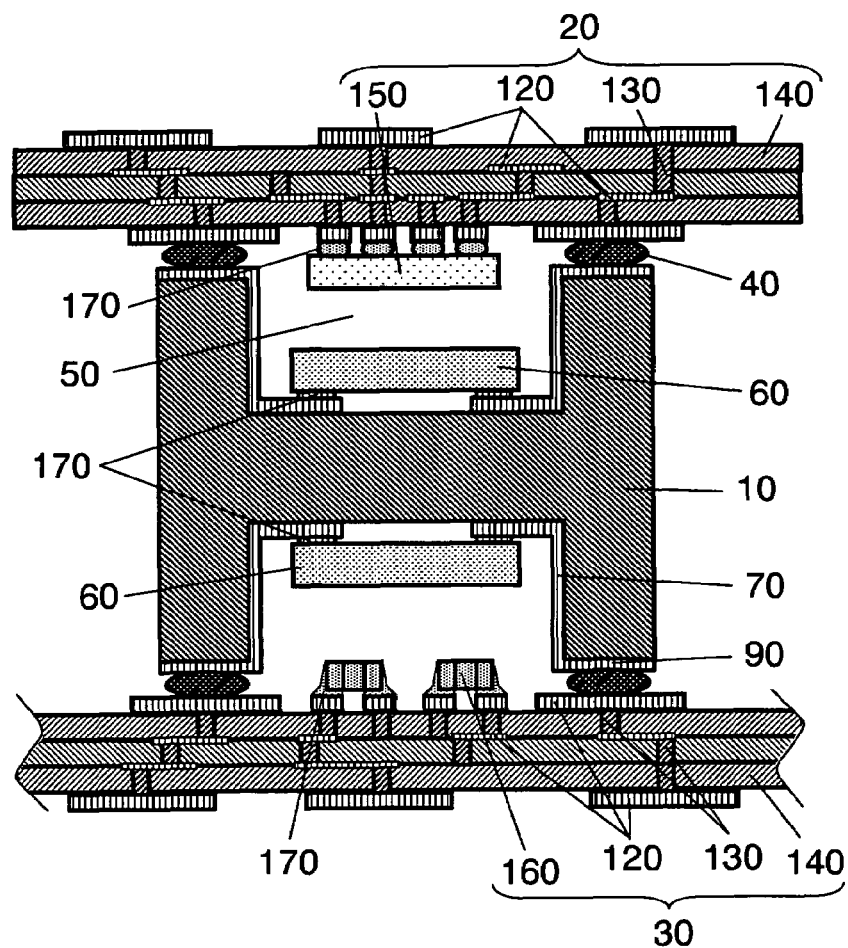
FIG. 1A is a cross sectional view of a stereoscopic electronic circuit device according to a first embodiment of the present invention.
Figure 1B:
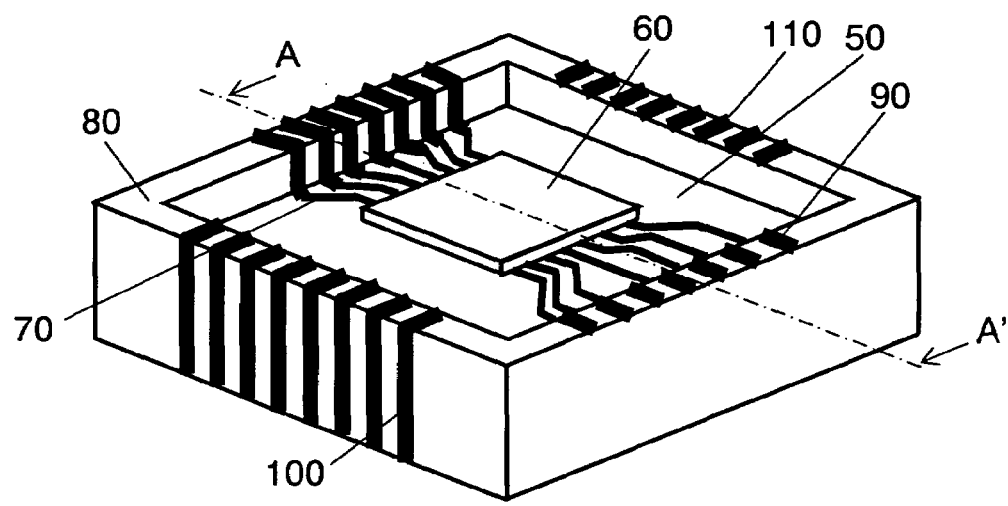
FIG. 1B is a perspective view of a relay board of the stereoscopic electronic circuit device according to the first embodiment of the present invention.

FIGS. 1A and 1B show the structure of a stereoscopic electronic circuit device according to a first embodiment of the present invention. FIG. 1A is a cross sectional view taken along the line A-A' of FIG. 1B, and FIG. 1B is a perspective view of relay board 10 shown in FIG. 1A.

The stereoscopic electronic circuit device has a three-dimensional connection structure in which first circuit board 20 and second circuit board 30 are connected with each other electrically and mechanically via relay board 10 disposed therebetween by using connection members 40. First circuit board 20 may be a part of an interconnection board to be connected with another circuit board. Second circuit board 30 may be a part of what is called a mother board. In short, relay board 10 has the function of connecting first circuit board 20 and second circuit board 30. Connection members 40 can be solder balls, micro connectors, heat seal connectors, anisotropic conductive films, soldering bumps or other kinds of bumps. Relay board 10 is bonded with pressure to first circuit board 20 and second circuit board 30 via connection members 40.

As shown in FIG. 1B, relay board 10 has recesses 50. Recesses 50 are mounted with electronic components 60 and are provided with lead-out wirings 70 extending from electronic components 60. The term "recesses" used here is not limited to the ones formed inside surfaces (recesses 50 in FIG. 1A) but includes concaves extending outside the surfaces (recesses 460 in FIG. 16B), which will be described later.

Relay board 10 also has land parts 90 for connecting between lead-out wirings 70 and first circuit board 20 or second circuit board 30 on its opposing surfaces that face first circuit board 20 or second circuit board 30 (hereinafter referred to as opposing surfaces 80). Hereinafter, the term opposing surfaces 80 do not include the recesses formed therein, unless otherwise noted.

Relay board 10 also has board interconnections 100 for connecting between first circuit board 20 and second circuit board 30 on its sides different from opposing surfaces 80 having land parts 90 thereon. Board interconnections 100 are connected with board connection lands 110 formed on opposing surfaces 80.

First circuit board 20 and second circuit board 30 are each formed of electrodes 120, conductive via holes (hereinafter referred to as via hole) 130 and insulating members 140. Alternatively, these boards can be a double side printed wiring board or a multilayer printed wiring board mounted with other electronic components 150 and 160. The electrodes of electronic components 60 and other electronic components 150 and 160 are electrically connected with the corresponding electrodes via connection members 170 such as solder or conductive adhesive. Electronic components 60, and other electric components 150 and 160 are general passive components such as semiconductor elements including ICs and LSIs, resistors, capacitors and inductors. Alternatively, it is possible to mount bare chip electronic components by flip chip mounting or wire bonding connection.

First circuit board 20 and second circuit board 30 can be made of general resin or inorganic boards. Particularly preferable are glass epoxy substrates, aramid substrates, build-up substrates, glass ceramic substrates, alumina substrates and the like. Relay board 10 is made of general thermoplastic or thermosetting resin. Thermoplastic resin allows relay board 10 to be molded into a desired shape by injection molding or another process. Thermosetting resin enables relay board 10 to be formed into a desired shape by cutting work. Preferable thermoplastic resins include: PPA (polyphthalamide), PPS (polyethylene sulfide), PBT (polybutylene terephthalate), ester-based resin and LCP (liquid crystal polymer). Preferable thermosetting resins include normal epoxy resins. In a case where relay board 10 is made of resin with a small Young's modulus, relay board 10 can reduce the stress caused by the difference in thermal expansion coefficient between first circuit board 20 and second circuit board 30.

The stereoscopic interconnections including lead-out wirings 70 of relay board 10 are formed either by a printing process with conductive paste, by applying metal foil or depositing a plated layer onto the board surface and then applying a laser process or by another method. The stereoscopic interconnections can be made from Ag, Sn, Zn, Pd, Bi, Ni, Au, Cu, C, Pt, Fe, Ti or Pb and so on.

The aforementioned stereoscopic electronic circuit device with the three-dimensional connection structure allows relay board 10 to mount electronic components 60 thereon, thereby achieving high density mounting, while securing the area for connecting between the circuit boards. Furthermore, other electronic components 150 and 160 mounted on first circuit board 20 and second circuit board 30 can be connected with electronic components 60 mounted on relay board 10 in the shortest distance so as to improve the high-frequency properties of the stereoscopic electronic circuit device, thereby achieving high-speed operation of the electronic device using the electronic circuit.

It is also possible to connect first circuit board 20 and second circuit board 30 via board connection lands 110 by providing via holes (not illustrated) penetrating opposing surfaces 80 of relay board 10. It is also possible to connect between electronic components 60 in recesses 50 of relay board 10 by providing via holes penetrating recesses 50 and then connecting the via holes with lead-out wirings 70 and the like. If it is unnecessary to connect first circuit board 20 and second circuit board 30 with each other, there is no need for providing board interconnections 100, via holes or board connection lands 110.

First circuit board 20 can be made up exclusively of an interconnection board, without mounting other electronic component 150.

In order to secure the connection strength and reliability, electronic components 60, other electronic components 150, 160 and recesses 50 may be molded out of molding resin.

It is also possible to mount a plurality of electronic components on one recess 50.

Figure 2A:
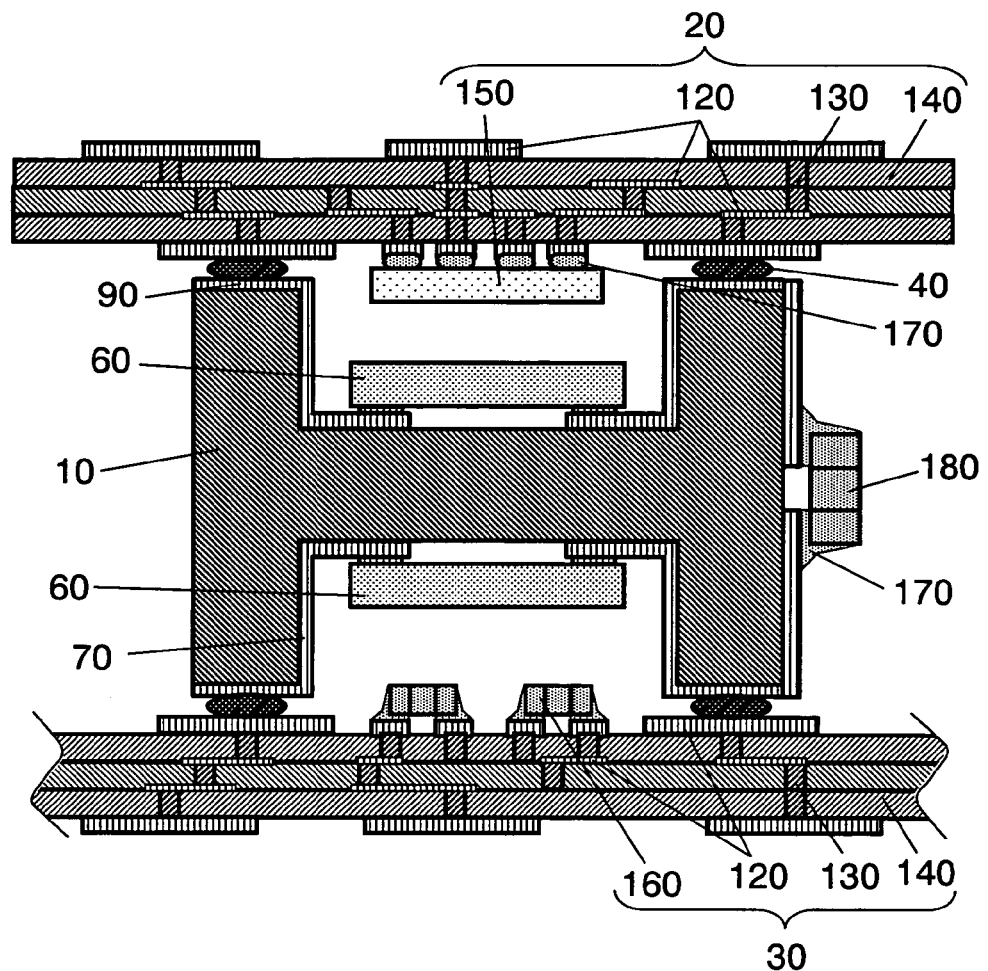
FIG. 2A is a cross sectional view of a first modified example of the stereoscopic electronic circuit device according to the first embodiment of the present invention.
Figure 2B:
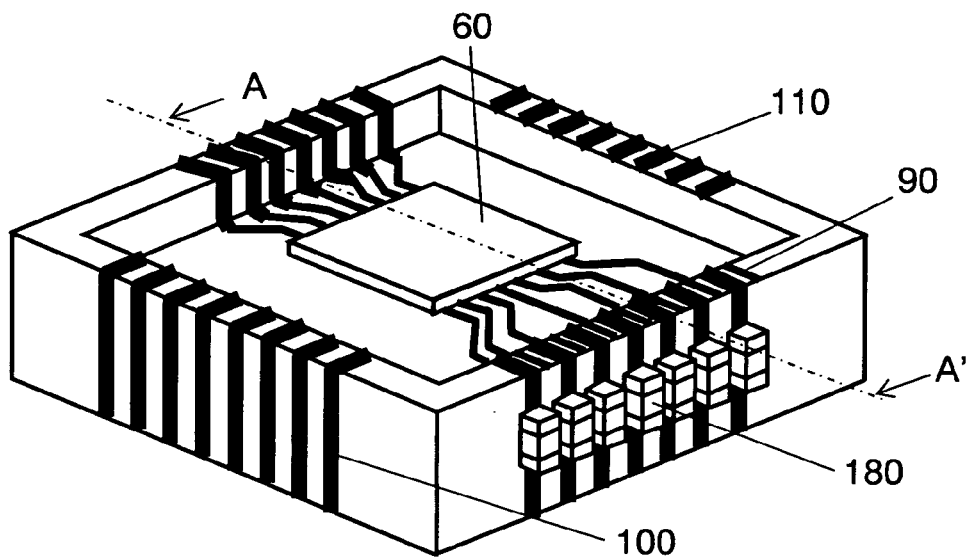
FIG. 2B is a perspective view of a relay board of the first modified example of the stereoscopic electronic circuit device according to the first embodiment of the present invention.

FIGS. 2A and 2B show the structure of the stereoscopic electronic circuit device according to a first modified example of the first embodiment of the present invention. FIG. 2A is a cross sectional view taken along the line A-A' of FIG. 2B, and FIG. 2B is a perspective view of relay board 10 shown in FIG. 2A.

In FIGS. 2A and 2B, a side surface of relay board 10 is mounted with electronic component 180. In this structure, any electronic component smaller in size than the side surface can be mounted thereon. Chip capacitors and chip resistors in particular can be suitably mounted.

Figure 3A:
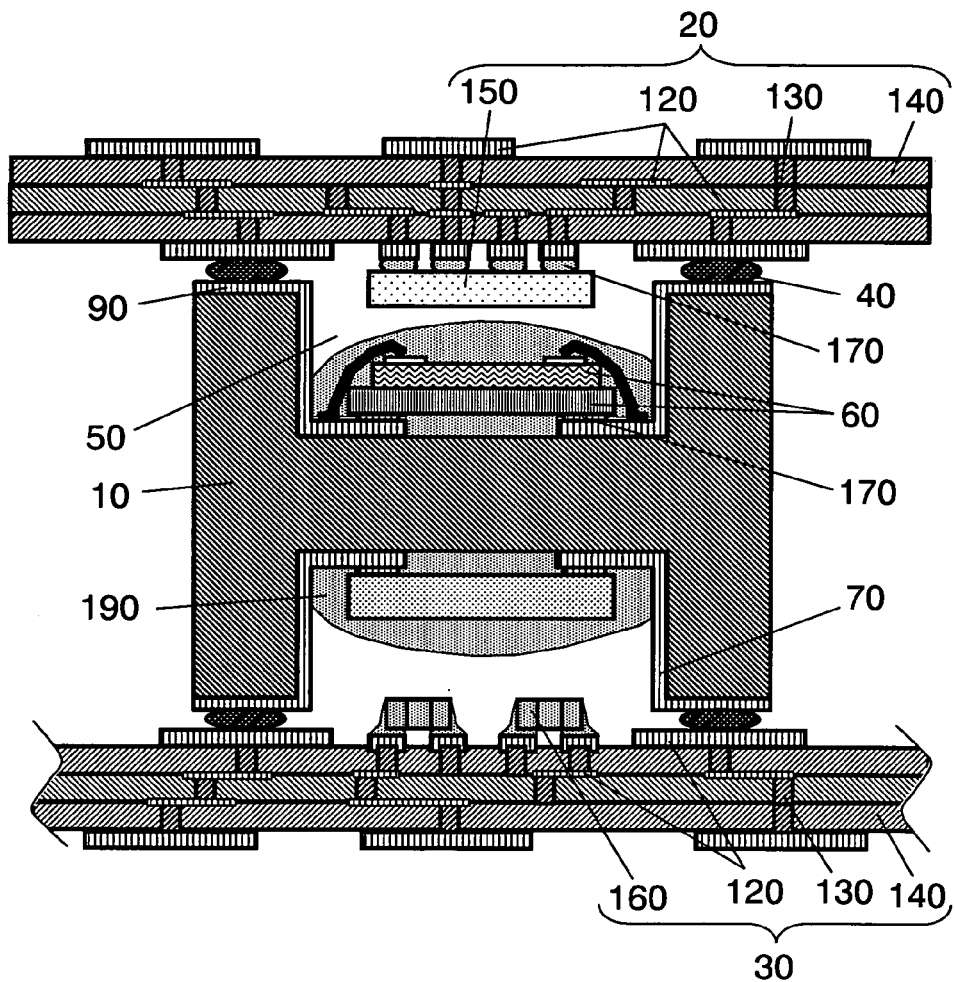
FIG. 3A is a cross sectional view of a second modified example of the stereoscopic electronic circuit device according to the first embodiment of the present invention.
Figure 3B:
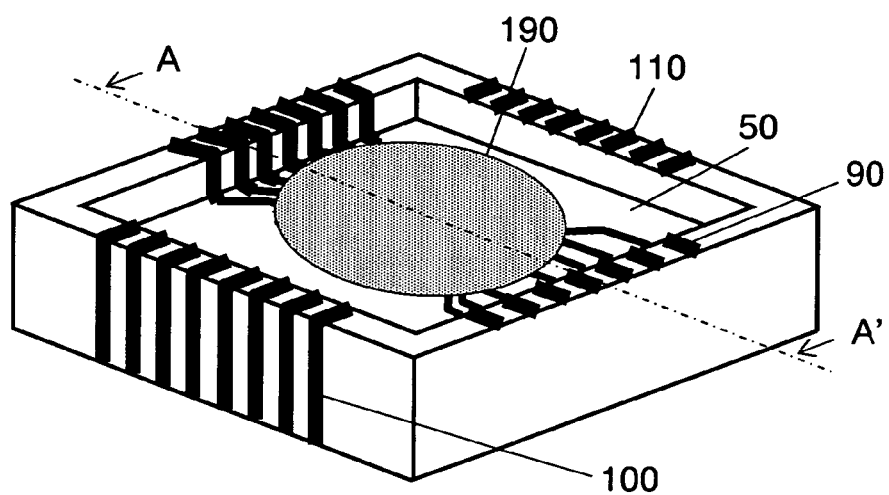
FIG. 3B is a perspective view of a relay board of the second modified example of the stereoscopic electronic circuit device according to the first embodiment of the present invention.

FIGS. 3A and 3B show the structure of the stereoscopic electronic circuit device according to a second modified example of the first embodiment of the present invention. FIG. 3A is a cross sectional view taken along the line A-A' of FIG. 3B, and FIG. 3B is a perspective view of relay board 10 shown in FIG. 3A. In this structure, electronic components 60 shaped like thin plates or chips are stacked in one of recesses 50 of relay board 10.

Figure 4A:
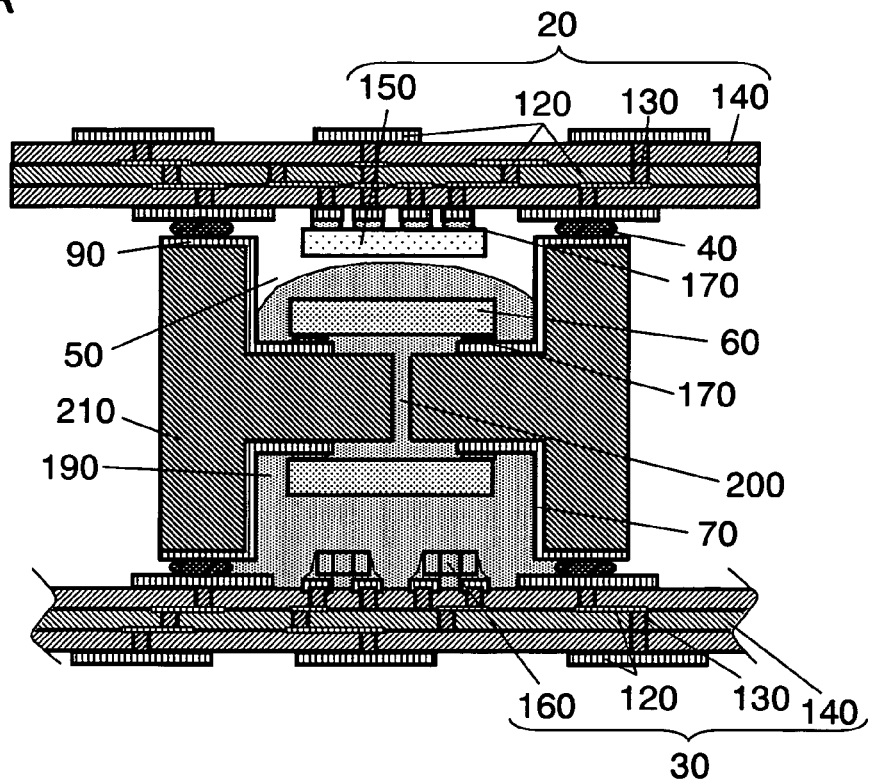
FIG. 4A is a cross sectional view of a third modified example of the stereoscopic electronic circuit device according to the first embodiment of the present invention.
Figure 4B:
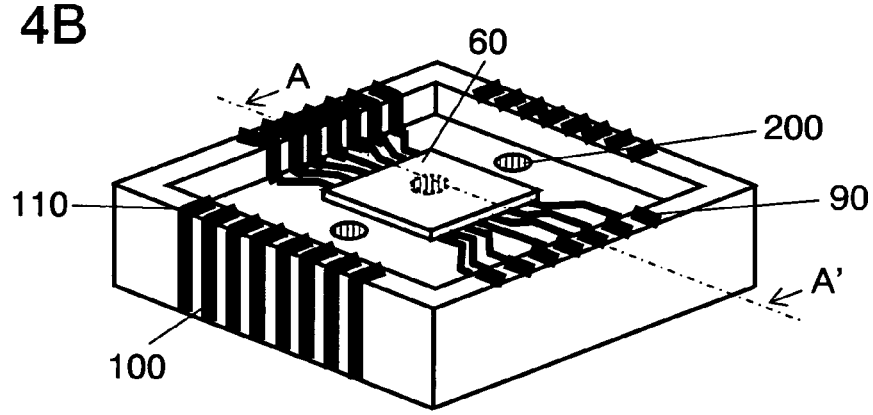
FIG. 4B is a perspective view of a relay board before molding of the third modified example of the stereoscopic electronic circuit device according to the first embodiment of the present invention.
Figure 4C:
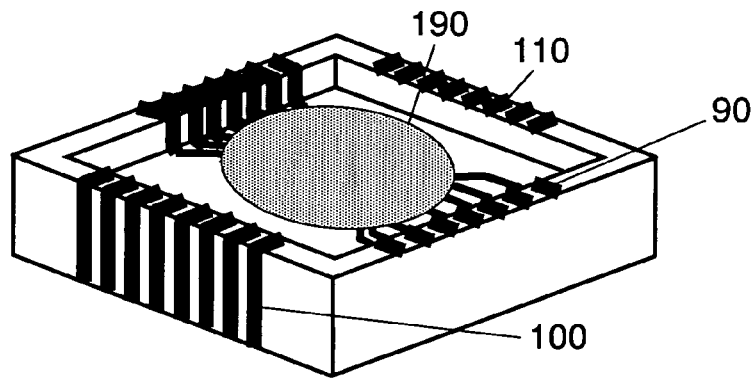
FIG. 4C is a perspective view of the relay board after molding of the third modified example of the stereoscopic electronic circuit device according to the first embodiment of the present invention.

FIGS. 4A-4C show the structure of the stereoscopic electronic circuit device according to a third modified example of the first embodiment of the present invention. FIG. 4A is a cross sectional view taken along the line A-A' of FIG. 4B, and FIGS. 4B and 4C are perspective views of relay board 210 of FIG. 4A before and after being sealed using molding resin 190. When through-hole 200 is formed between recesses 50 of relay board 210 and then electronic components 60 are resin-molded, recess 50 on the bottom side is nearly entirely filled with molding resin 190. This structure improves not only the bonding strength between relay board 210 and second circuit board 30 but also the reliability of electronic components 60 sealed using molding resin 190.

Second Embodiment

Figure 5A:
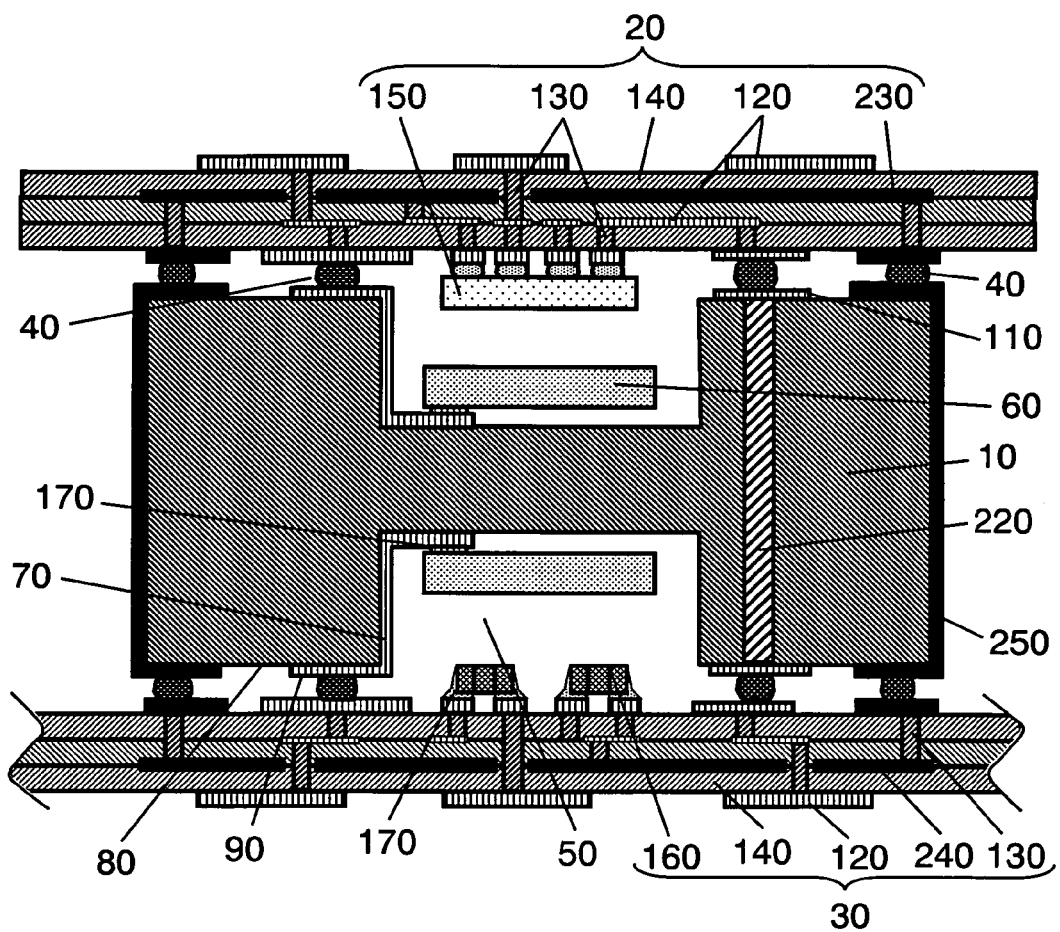
FIG. 5A is a cross sectional view of a stereoscopic electronic circuit device according to a second embodiment of the present invention.
Figure 5B:
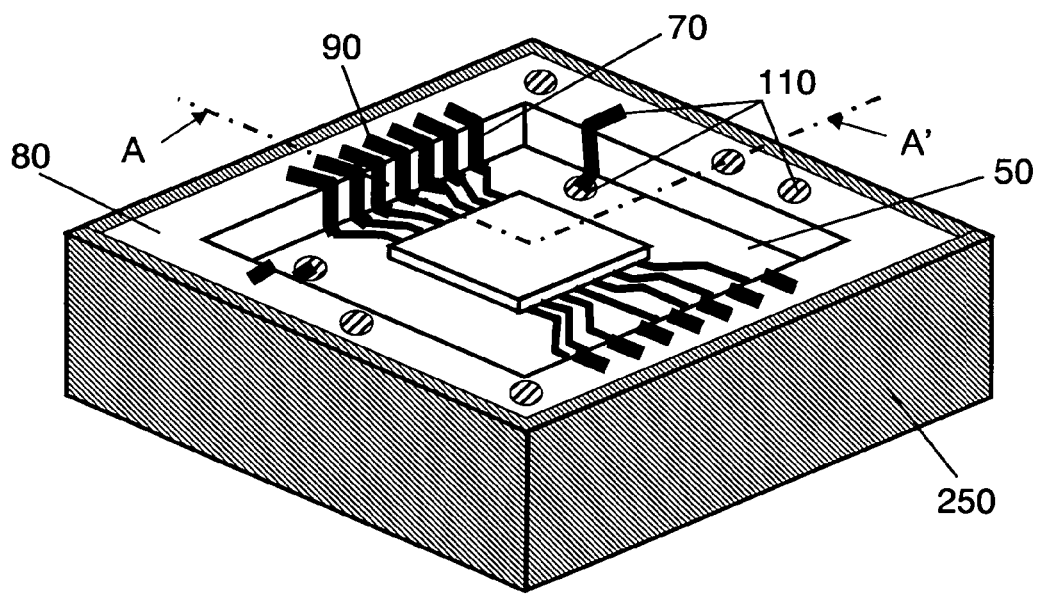
FIG. 5B is a perspective view of a relay board of the stereoscopic electronic circuit device according to the second embodiment of the present invention.

FIGS. 5A and 5B show the structure of a stereoscopic electronic circuit device according to a second embodiment of the present invention. FIG. 5A is a cross sectional view taken along the line A-A' of FIG. 5B, and FIG. 5B is a perspective view of relay board 10 shown in FIG. 5A.

Similar to that of the first embodiment, this stereoscopic electronic circuit device has a three-dimensional connection structure in which first circuit board 20 and second circuit board 30 are connected with each other electrically and mechanically via relay board 10 disposed therebetween by using connection members 40.

As shown in FIG. 5B, relay board 10 has recesses 50. Recesses 50 are mounted with electronic components 60 and are provided with lead-out wirings 70 extending from electronic components 60. Relay board 10 also has land parts 90 which are connected with lead-out wirings 70, and which connect between lead-out wirings 70 and first circuit board 20 or second circuit board 30 on opposing surfaces 80 that face first circuit board 20 or second circuit board 30.

It is also possible, when necessary, to provide board connection lands 110 for connecting between first circuit board 20 and second circuit board 30 onto opposing surfaces 80 or recesses 50 of relay board 10 through via holes 220 penetrating in the direction towards opposing surfaces 80. Furthermore, at least part of and preferably the whole of the outer surface of relay board 10 is covered with third shield conductor 250. First circuit board 20 is formed of electrodes 120, via holes 130, first shield conductor 230 and insulating members 140. When necessary, first circuit board 20 may be mounted with other electronic component 150 so as to make a double side or multilayer printed wiring board. Similarly, second circuit board 30 is formed of electrodes 120, via holes 130, second shield conductor 240 and insulating members 140. When necessary, second circuit board 30 may be mounted with other electronic component 160 so as to make a double sided or multilayer interconnection board. First shield conductor 230 of first circuit board 20 and second shield conductor 240 of second circuit board 30 are provided throughout, except for the regions of via holes 130. Via holes 130, if they are ground electrodes, may be connected with first shield conductor 230 or second shield conductor 240. The electrodes of electronic components 60 and other electronic components 150 and 160 are electrically connected with the corresponding electrodes via connection members 170 such as solder or conductive adhesive.

In the aforementioned stereoscopic electronic circuit device with the three-dimensional connection structure, first shield conductor 230 of first circuit board 20, second shield conductor 240 of second circuit board 30 and third shield conductor 250 provided on the outer surface of relay board 10 can be connected with each other to shield radiation noise coming from an external electronic device or going out of the stereoscopic electronic circuit device.

Specifically, first of all, electronic component 150 on first circuit board 20 and electronic component 160 on second circuit board 30 are connected with each other inside relay board 10. At the same time, first shield conductor 230 of first circuit board 20 and second shield conductor 240 of second circuit board 30 are connected with each other via third shield conductor 250 provided on the outer surface of relay board 10. This structure can completely separate the electronic components mounted inside relay board 10 from outside, thereby obtaining a high shielding effect. The gaps between via holes 130 and first shield conductor 230 or second shield conductor 240 are preferably not more than ½ of the frequency to be used. However, the gap size is not limited to this, and can be designed in accordance with radiation power or the anti-noise performance of the electronic components.

Figure 6A:
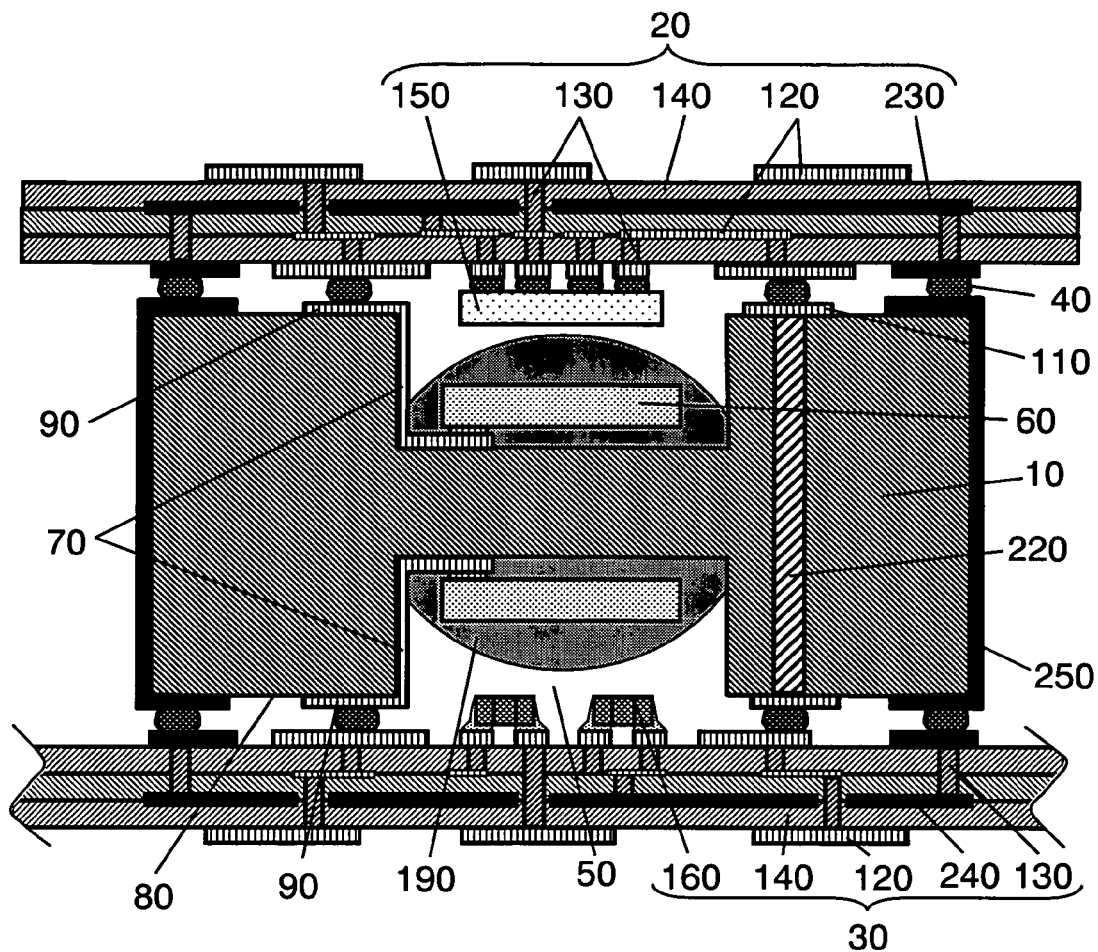
FIG. 6A is a cross sectional view of a first modified example of the stereoscopic electronic circuit device according to the second embodiment of the present invention.
Figure 6B:
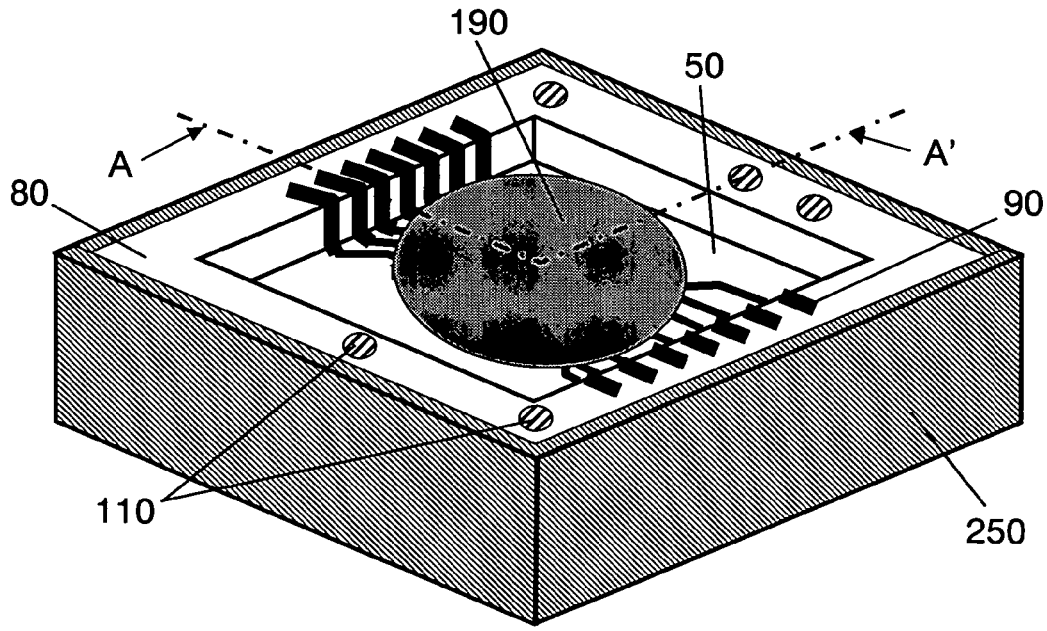
FIG. 6B is a perspective view of a relay board of the first modified example of the stereoscopic electronic circuit device according to the second embodiment of the present invention.

As shown in a first modified example of the stereoscopic electronic circuit device shown in FIGS. 6A and 6B, electronic components 60 and recesses 50 can be resin-shielded by using insulating molding resin 190 to stabilize connection strength and to improve reliability including moisture resistance.

Figure 7A:
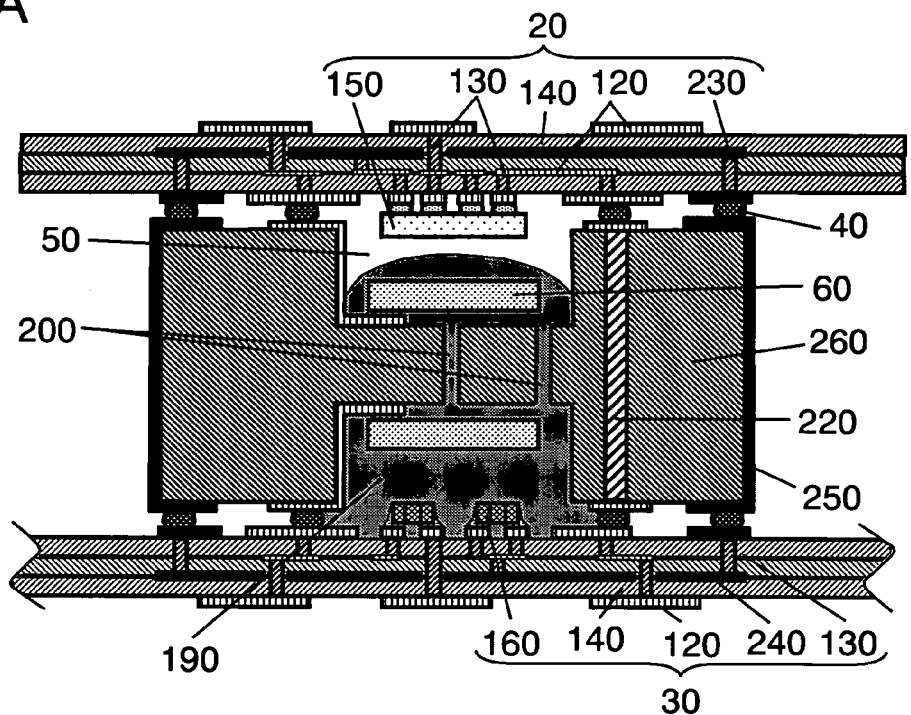
FIG. 7A is a cross sectional view of a second modified example of the stereoscopic electronic circuit device according to the second embodiment of the present invention.
Figure 7B:
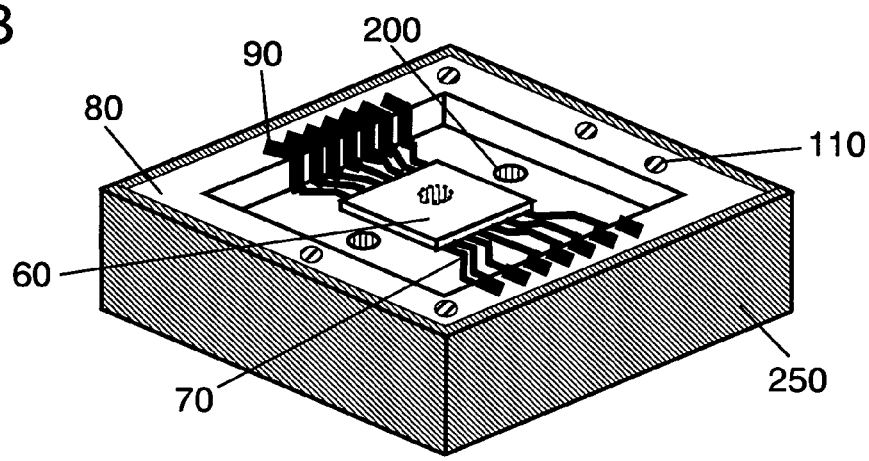
FIG. 7B is a perspective view of a relay board before molding of the second modified example of the stereoscopic electronic circuit device according to the second embodiment of the present invention.
Figure 7C:
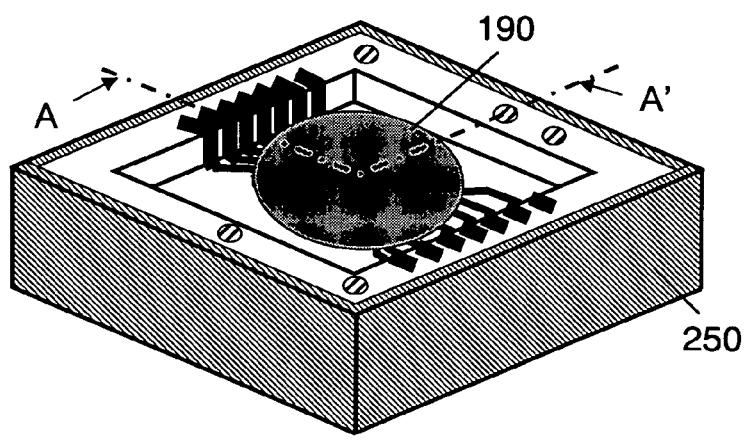
FIG. 7C is a perspective view of the relay board after molding of the second modified example of the stereoscopic electronic circuit device according to the second embodiment of the present invention.

FIGS. 7A-7C show the structure of a stereoscopic electronic circuit device according to a second modified example of the second embodiment of the present invention.

FIG. 7A is a cross sectional view of the stereoscopic electronic circuit device taken along the line A-A' of FIG. 7C. FIGS. 7B and 7C are perspective views of relay board 260 before and after being resin-shielded using molding resin 190, respectively. Recesses 50 of relay board 260 are provided with throughholes 200, so that when electronic components 60 are resin-shielded using molding resin 190, recesses 50 can be nearly fully filled with molding resin 190. This structure improves the bonding strength between relay board 260 and second circuit board 30, thereby stabilizing the connection strength between the electrodes. The resin-shielding of electronic components 60 using molding resin 190 also improves reliability including moisture resistance.

Figure 8A:
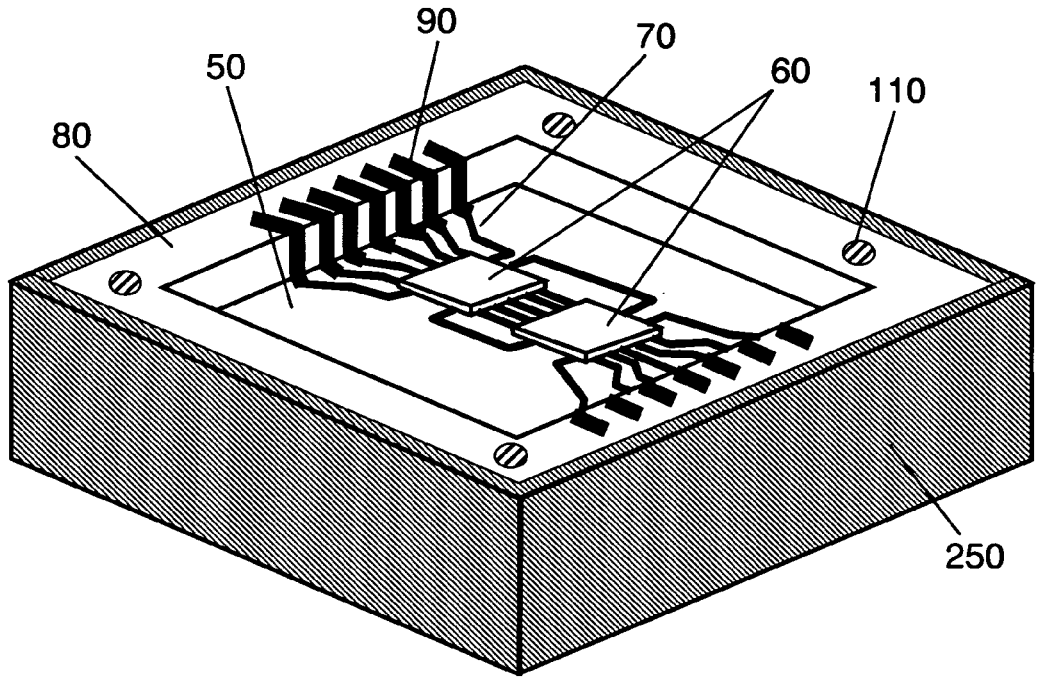
FIGS. 8A, 8B are perspective views of a relay board of a third modified example of the stereoscopic electronic circuit device according to the second embodiment of the present invention.
Figure 8B:
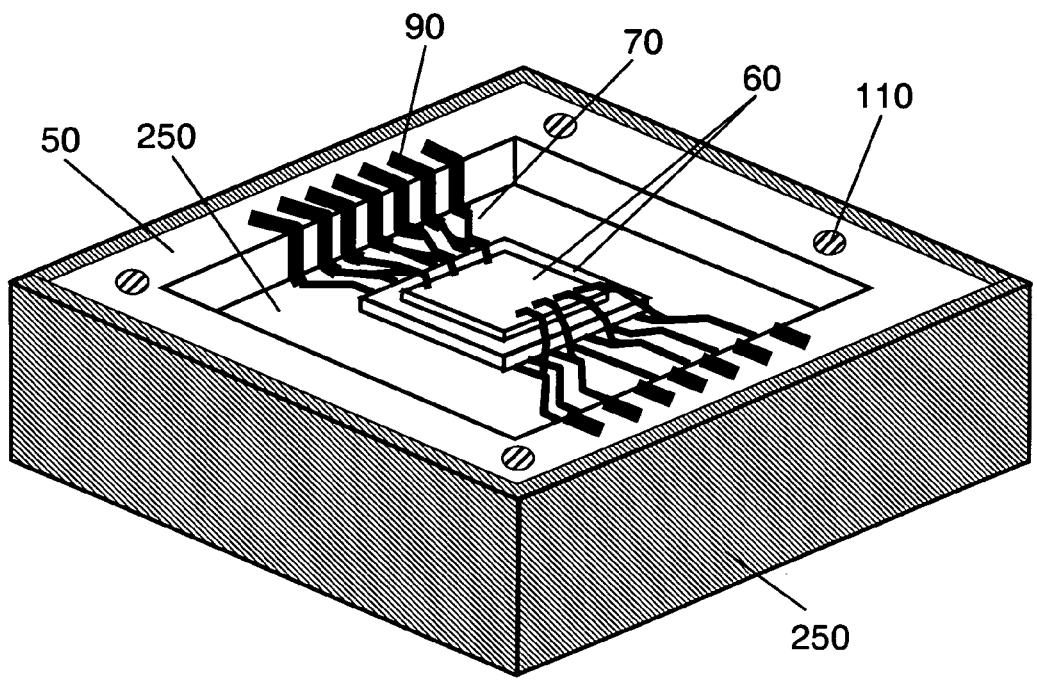

FIGS. 8A and 8B are perspective views of a relay board of a third modified example of the second embodiment of the present invention.

A plurality of electronic components 60 may be laid on one recess 50 as shown in FIG. 8A, or be stacked one on top of another as shown in FIG. 8B. Either can achieve much higher density mounting.

Figure 9A:
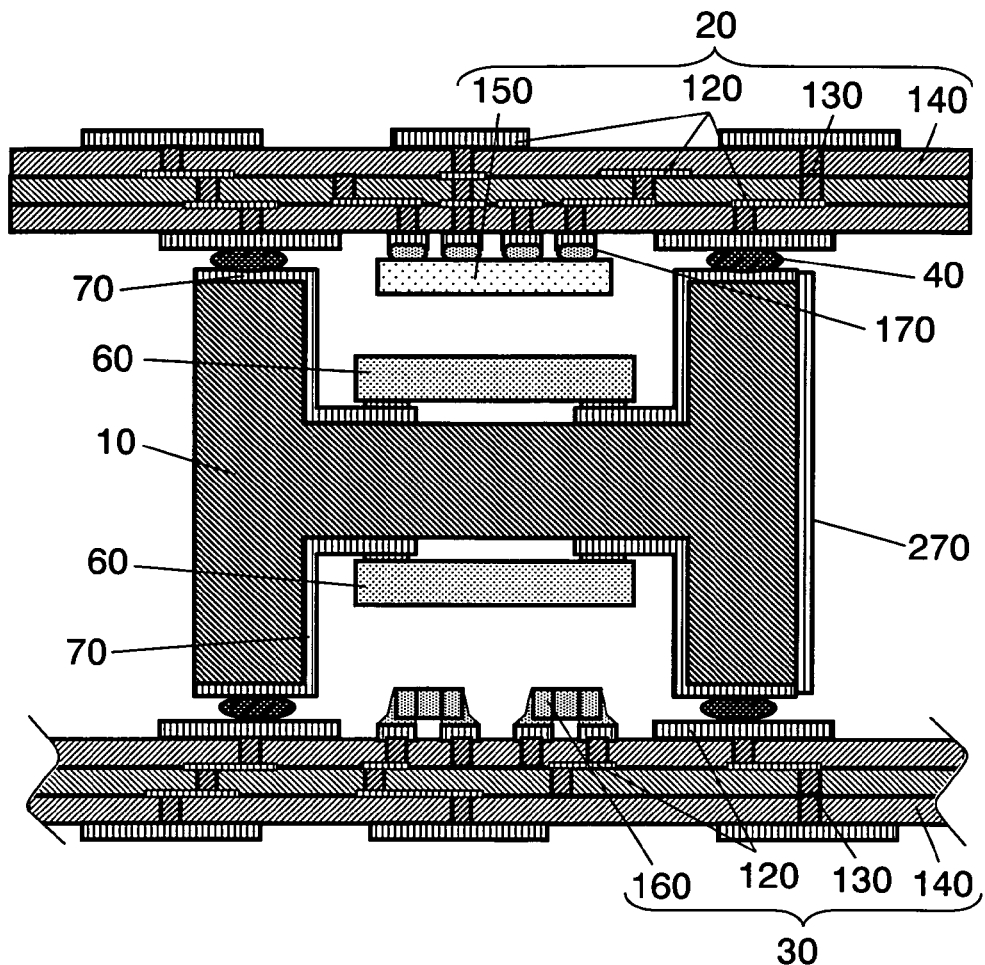
FIG. 9A is a cross sectional view of a fourth modified example of the stereoscopic electronic circuit device according to the second embodiment of the present invention.
Figure 9B:
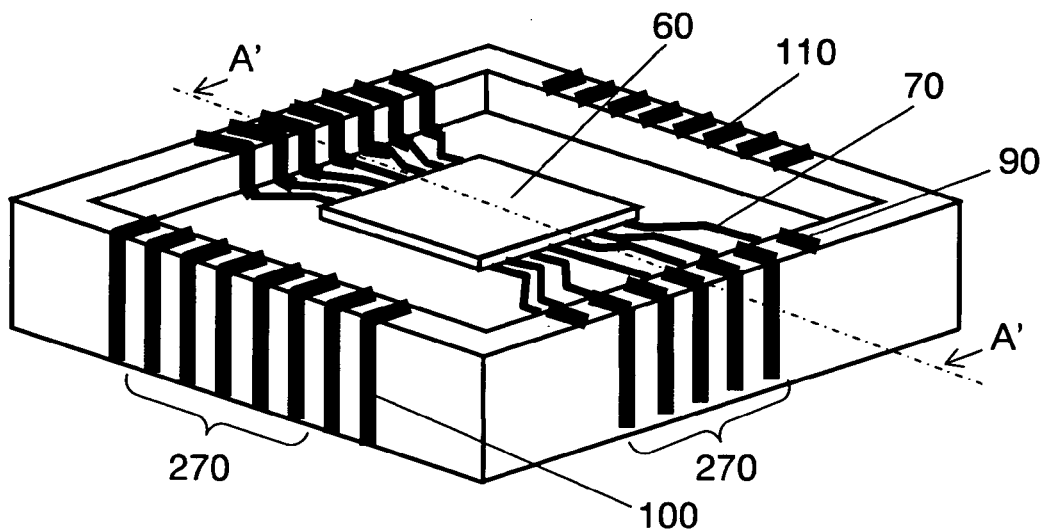
FIG. 9B is a perspective view of a relay board of the fourth modified example of the stereoscopic electronic circuit device according to the second embodiment of the present invention.

FIGS. 9A and 9B show the structure of a stereoscopic electronic circuit device according to a fourth modified example of the second embodiment of the present invention. FIG. 9A is a cross sectional view taken along the line A-A' of FIG. 9B, and FIG. 9B is a perspective view of relay board 10 shown in FIG. 9A. Relay board 10 is provided, on its side surface, with shield electrodes 270 having an electromagnetic shielding effect. Shield electrodes 270 are formed by extending ground interconnections out of lead-out wirings 70 extending from electronic components 60 to the side surface. Alternatively, shield electrodes 270 may be formed by bundling ground interconnections out of board interconnections 100 for connecting first circuit board 20 and second circuit board 30.

As shown in this structure, a simple structure of providing shield electrodes 270 exclusively on specific region can reduce spurious radiation from electronic components 60 or prevent the occurrence of circuit malfunction due to external noise.

Figure 10A:
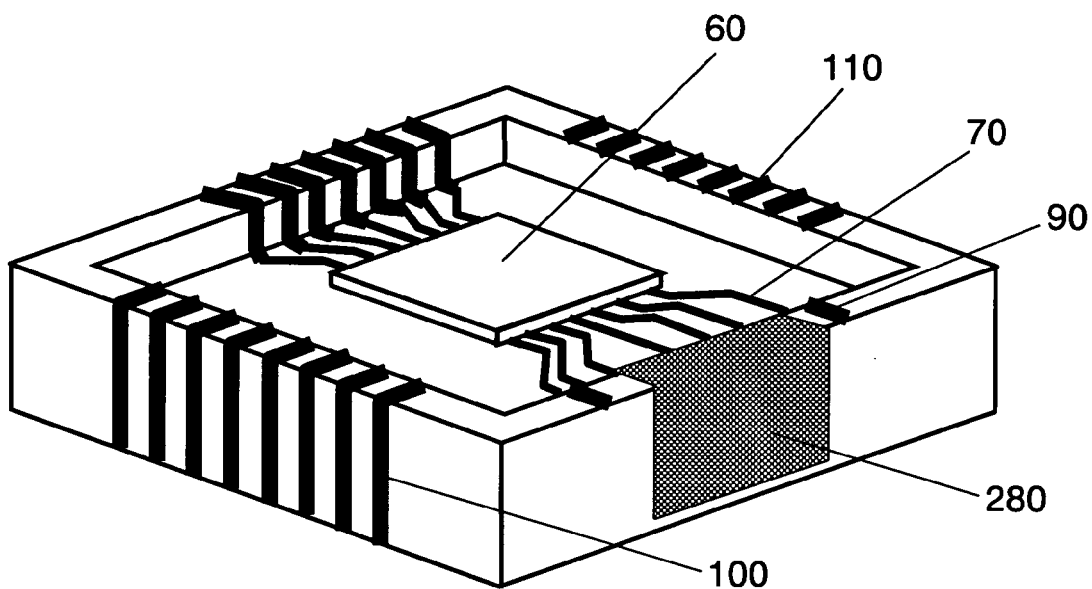
FIGS. 10A, 10B are perspective views of a relay board of a fifth modified example of the stereoscopic electronic circuit device according to the second embodiment of the present invention.
Figure 10B:
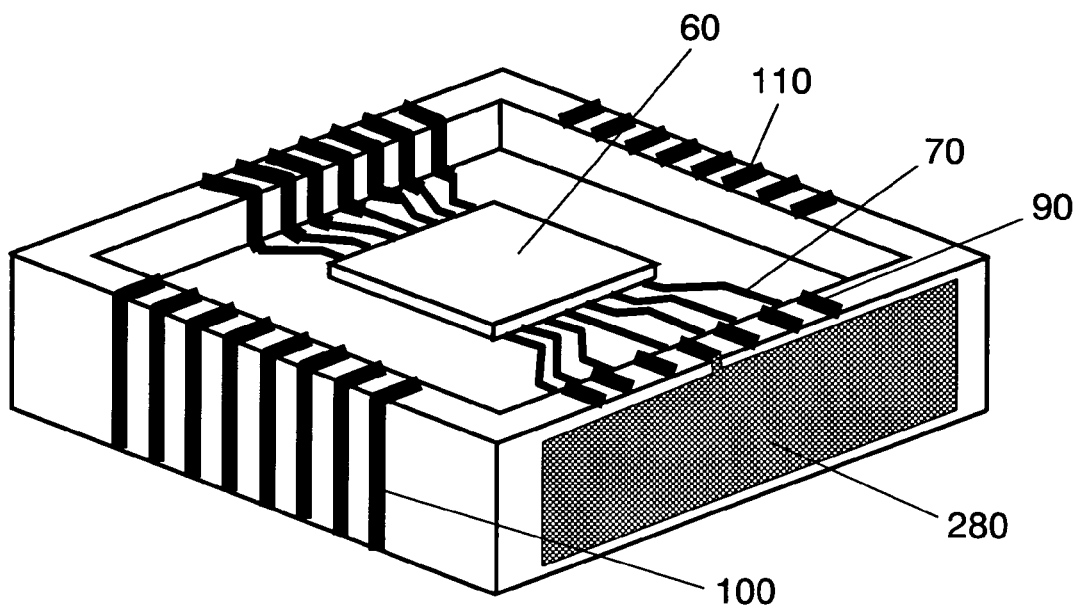

FIGS. 10A and 10B show a relay board according to a fifth modified example of the second embodiment of the present invention. As shown in the perspective views of FIGS. 10A and 10B, of lead-out wirings 70, wirings leading to the ground are formed on a side surface as shield electrodes 280 having a flat shape. This structure can improve the effect of reducing the spurious radiation from electronic components 60 and the like.

Third Embodiment

Figure 11A:
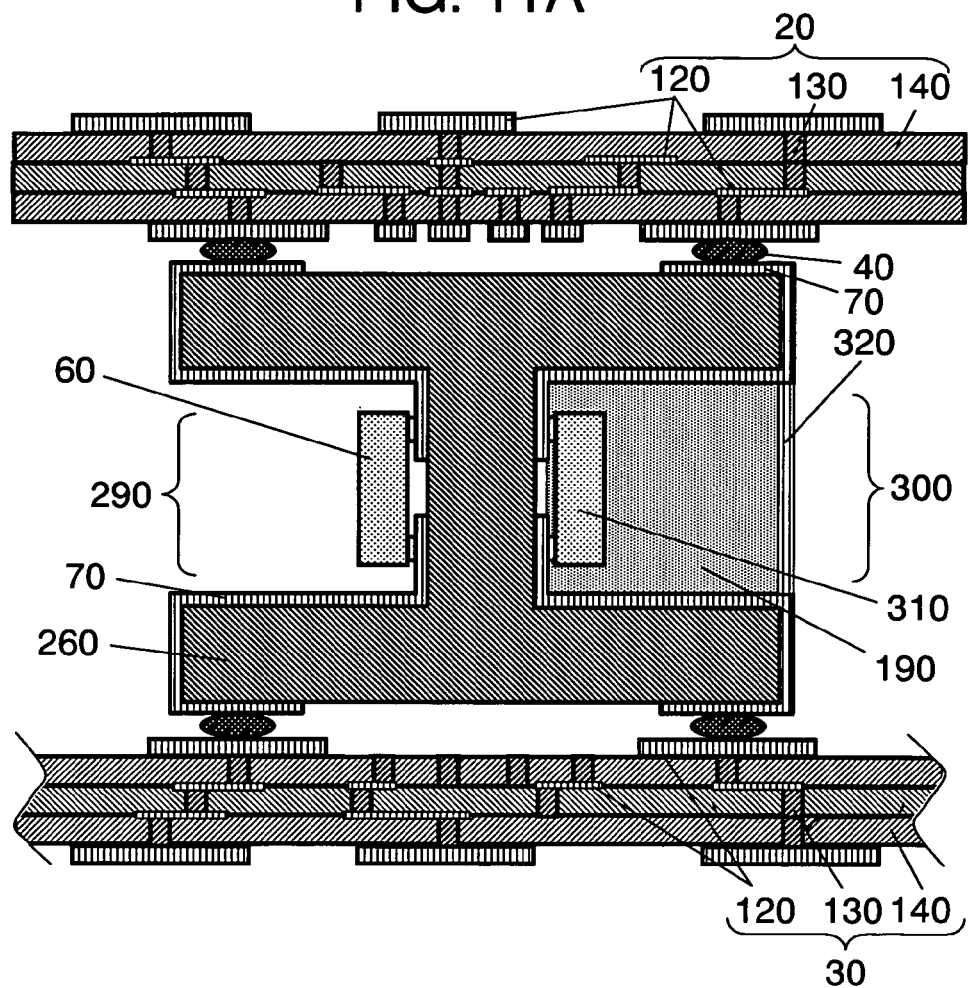
FIG. 11A is a cross sectional view of a stereoscopic electronic circuit device according to a third embodiment of the present invention.
Figure 11B:
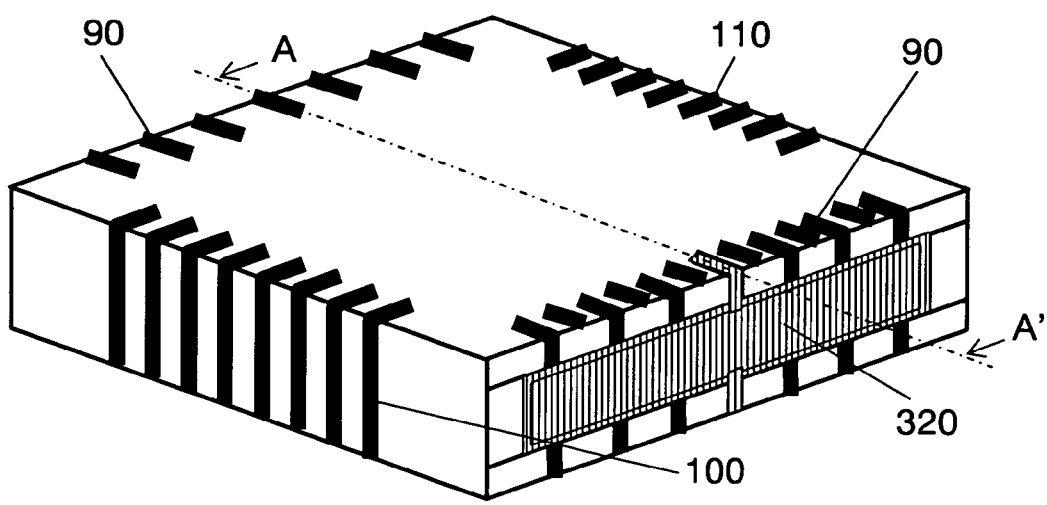
FIG. 11B is a perspective view of a relay board of the stereoscopic electronic circuit device according to the third embodiment of the present invention.

FIGS. 11A and 11B show the structure of a stereoscopic electronic circuit device according to a third embodiment of the present invention. FIG. 11A is a cross sectional view taken along the line A-A' of FIG. 11B, and FIG. 11B is a perspective view of relay board 260 shown in FIG. 11A.

In FIG. 11A, relay board 260 has, on its side surface other than opposed surfaces 80, recess 290 on which to mount electronic component 60. The side surface is provided with lead-out wirings 70 extending from electronic component 60, and with board interconnections 100 for connecting first circuit board 20 and second circuit board 30. Opposing surfaces 80 of relay board 260 are provided with land parts 90 to be connected to lead-out wirings 70, and also provided with board connection lands 110 to be connected to board interconnections 100. Relay board 26 has another side surface having another recess 300 formed thereon which is mounted with electronic component 310 and which is molded using molding resin 190. The surface of molding resin 190 is smoothed and is provided with shield electrodes 320 thereon to be connected with ground electrodes.

This structure can shield electronic component 310 and others which cause noise or are vulnerable to external noise by separating them from electronic component 60 and the like, thereby improving reliability. The structure of relay board 260 can not only connect between first circuit board 20 and second circuit board 30, but also mount electronic components 60 and 310 on side surfaces.

Although in FIGS. 11A, 11B both first circuit board 20 and second circuit board 30 are multilayer circuit boards provided with electrodes 120, via holes 130 and insulating members 140, they may be double sided circuit boards instead.

Figure 12A:
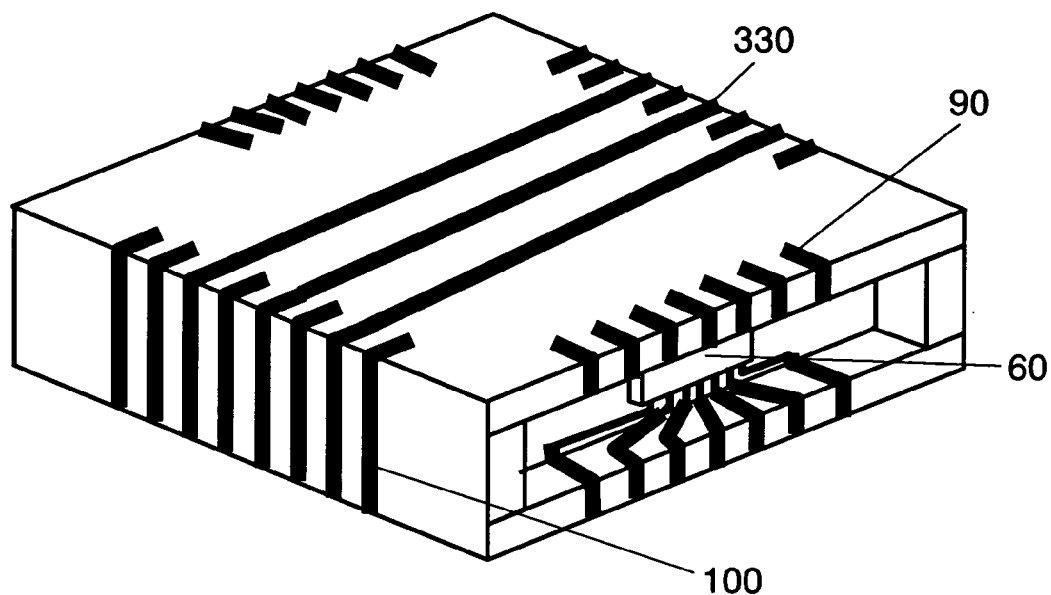
FIGS. 12A and 12B are perspective views of a relay board of a first modified example of the stereoscopic electronic circuit device according to the third embodiment of the present invention.
Figure 12B:
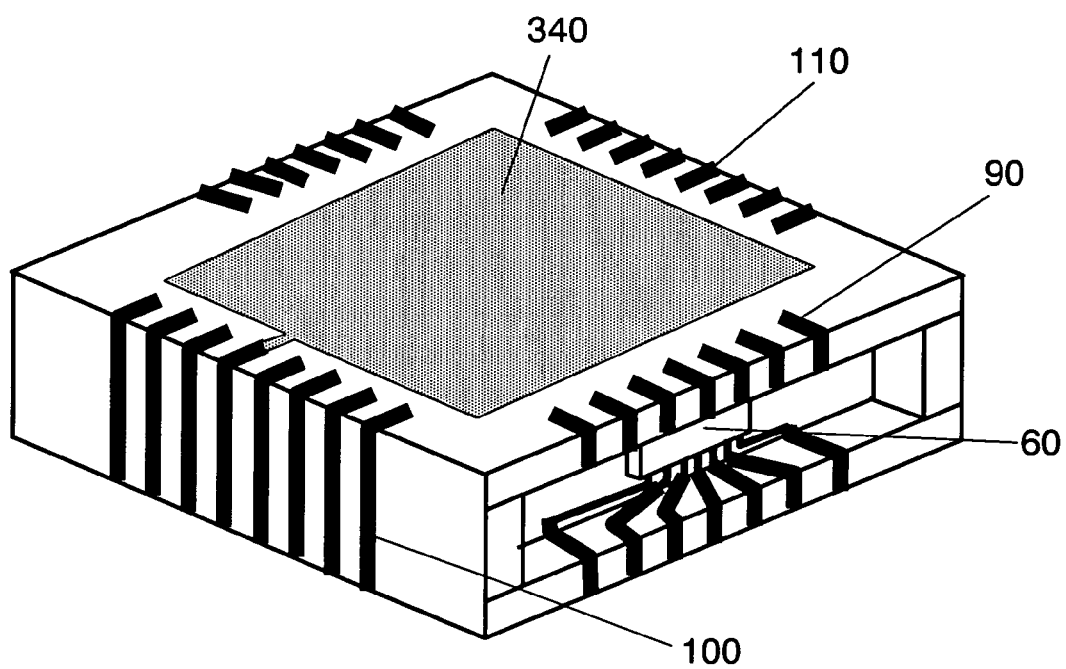

FIGS. 12A and 12B show a relay board of a first modified example of the third embodiment of the present invention.

As shown in the perspective view of the relay board in FIG. 12A, side-surface interconnections 330 for connecting between the ground electrodes of board interconnections 100 on one side surface and the corresponding ground electrodes of board interconnections 100 on the opposite side surface of the relay board are formed on opposing surfaces 80. With this structure, the interconnections connected with a plurality of ground electrodes are connected with each other to strengthen the ground, thereby shielding electric noise. Alternatively, as shown in the perspective view of the relay board shown in FIG. 12B, the ground electrodes can be strengthened by providing shield electrodes 340 having a flat shape on opposing surfaces 80 of the relay board.

Figure 13A:
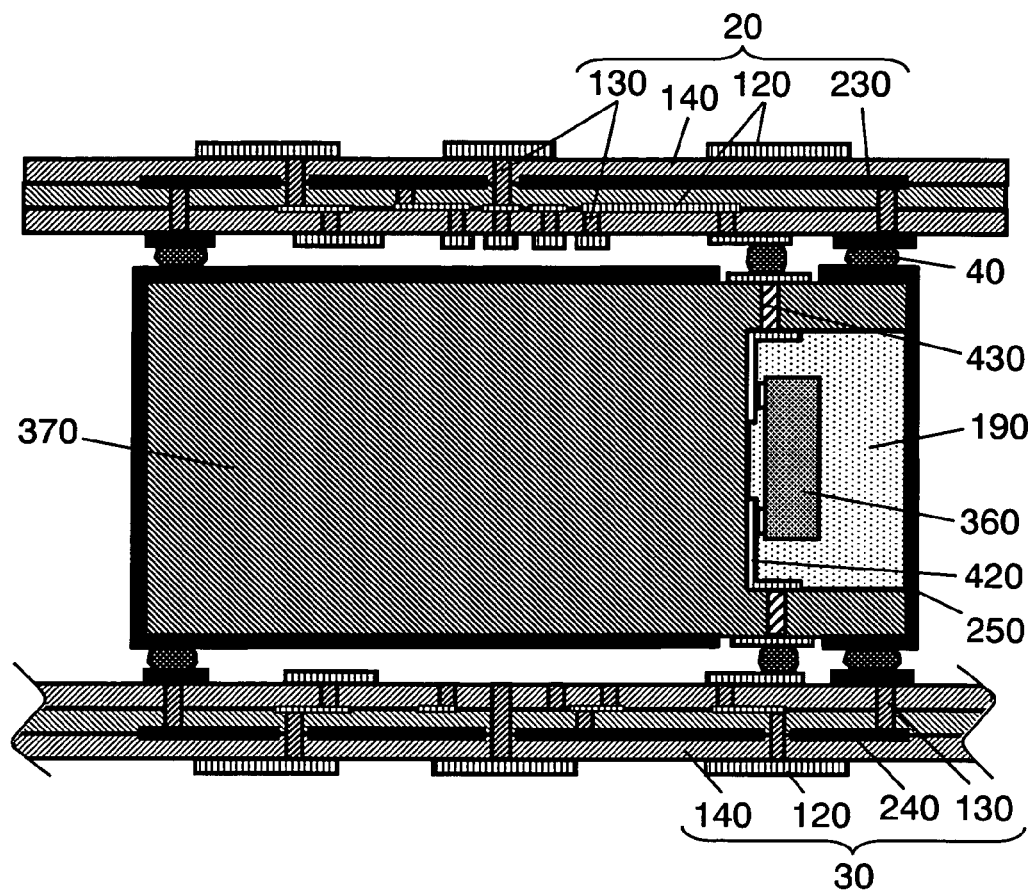
FIG. 13A is a cross sectional view of a second modified example of the stereoscopic electronic circuit device according to the third embodiment of the present invention.
Figure 13B:
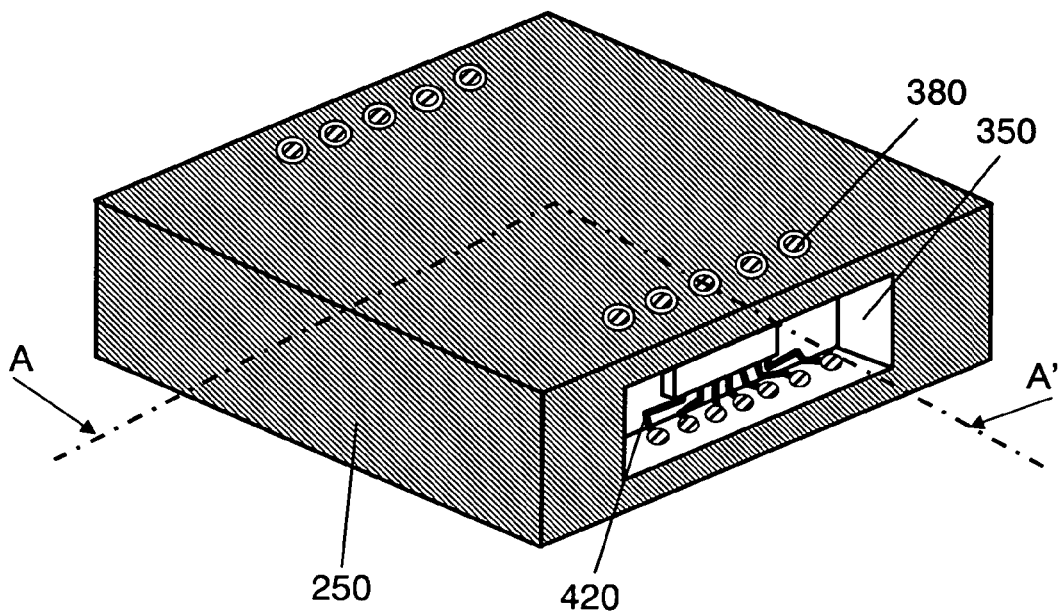
FIG. 13B is a perspective view of a relay board of the second modified example of the stereoscopic electronic circuit device according to the third embodiment of the present invention.

FIGS. 13A and 13B show the structure of a stereoscopic electronic circuit device according to a second modified example of the third embodiment of the present invention.

As shown in FIGS. 13A and 13B, recesses 350 on which to mount electronic components 360 are formed on side surfaces other than opposing surfaces 80 of relay board 370, and third shield conductor 250 is provided on the entire surface, except for the region of land parts 380 formed on opposing surfaces 80 of relay board 370. This structure secures the protection of electronic component 360 vulnerable to noise and the like.

Fourth Embodiment

Figure 14A:
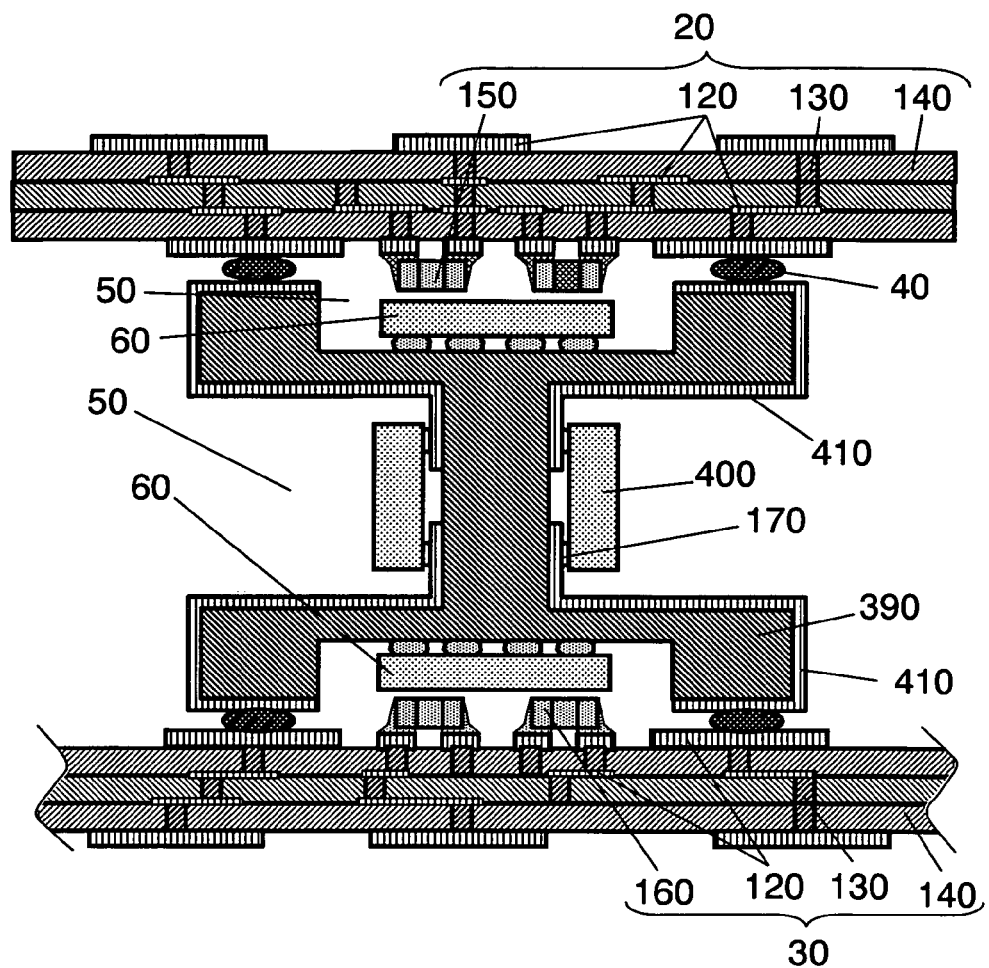
FIG. 14A is a cross sectional view of a stereoscopic electronic circuit device according to a fourth embodiment of the present invention.
Figure 14B:
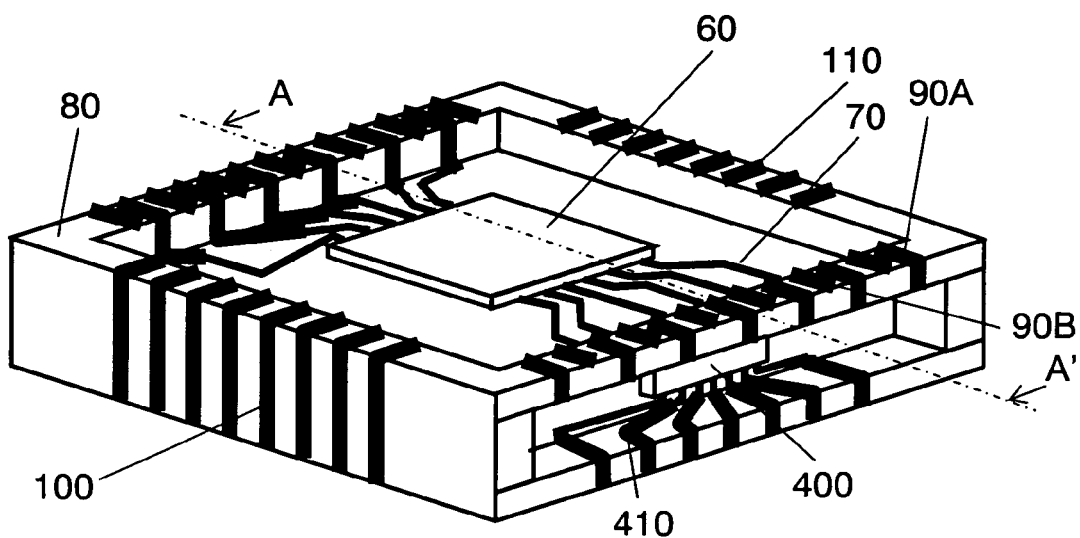
FIG. 14B is a perspective view of a relay board of the stereoscopic electronic circuit device according to the fourth embodiment of the present invention.

FIGS. 14A and 14B show the structure of a stereoscopic electronic circuit device according to a fourth embodiment of the present invention. FIG. 14A is a cross sectional view taken along the line A-A' of FIG. 14B, and FIG. 14B is a perspective view of relay board 390 shown in FIG. 14A.

This stereoscopic electronic circuit device has a three-dimensional connection structure in which first circuit board 20 and second circuit board 30 are connected with each other electrically and mechanically via relay board 390 disposed therebetween by using connection members 40. Relay board 390 has recesses on opposing surfaces 80 and on side surfaces so as to mount electronic components 60 and 400, respectively, thereon. In addition, opposing surfaces 80 of relay board 390 are provided with land parts 90A to be connected with lead-out wirings 70 extending from electronic components 60; land parts 90B to be connected with lead-out wirings 410 extending from electronic components 400 mounted on the side surfaces; and board connection lands 110 for connecting between first circuit board 20 and second circuit board 30.

The aforementioned stereoscopic electronic circuit device can mount other electronic component 150 and 160 on first circuit board 20 and second circuit board 30, and at the same time, mount electronic components 60 and 400 on recesses 50 of relay board 390, thereby achieving higher density mounting.

Figure 15A:
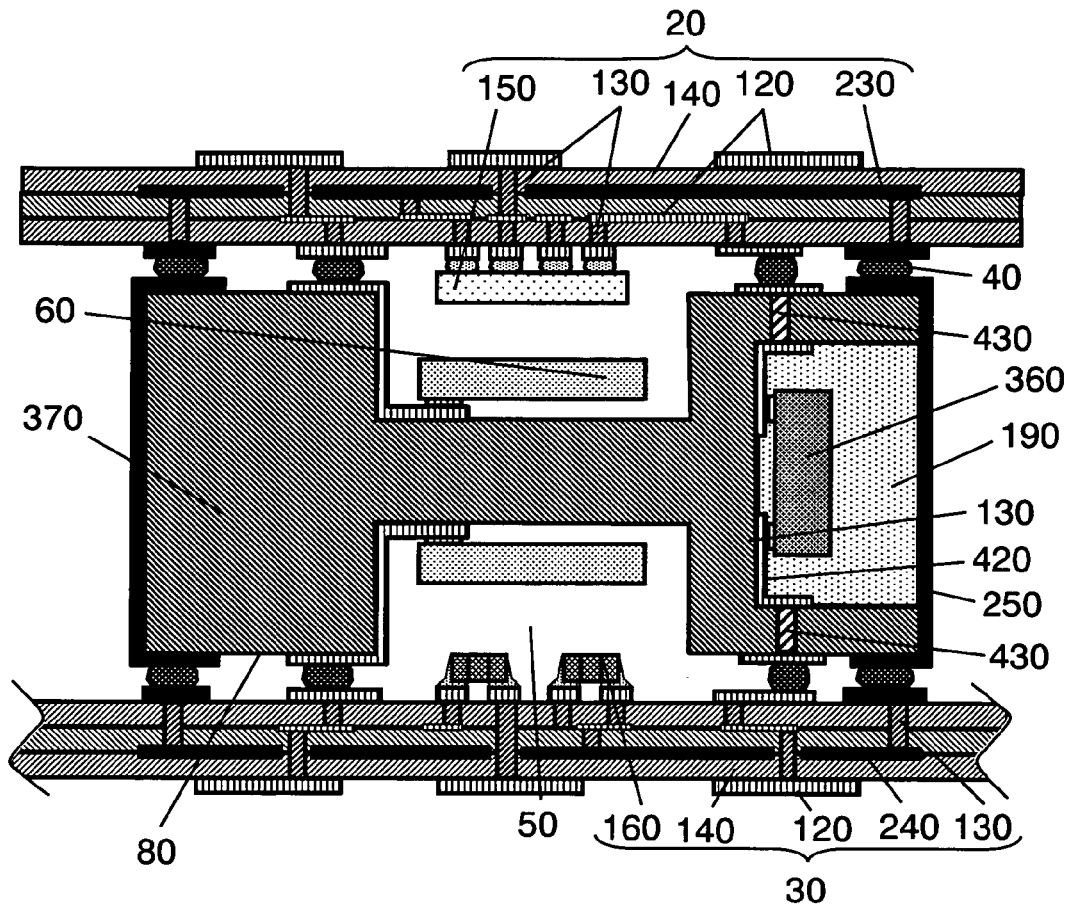
FIG. 15A is a cross sectional view of a first modified example of the stereoscopic electronic circuit device according to the fourth embodiment of the present invention.
Figure 15B:
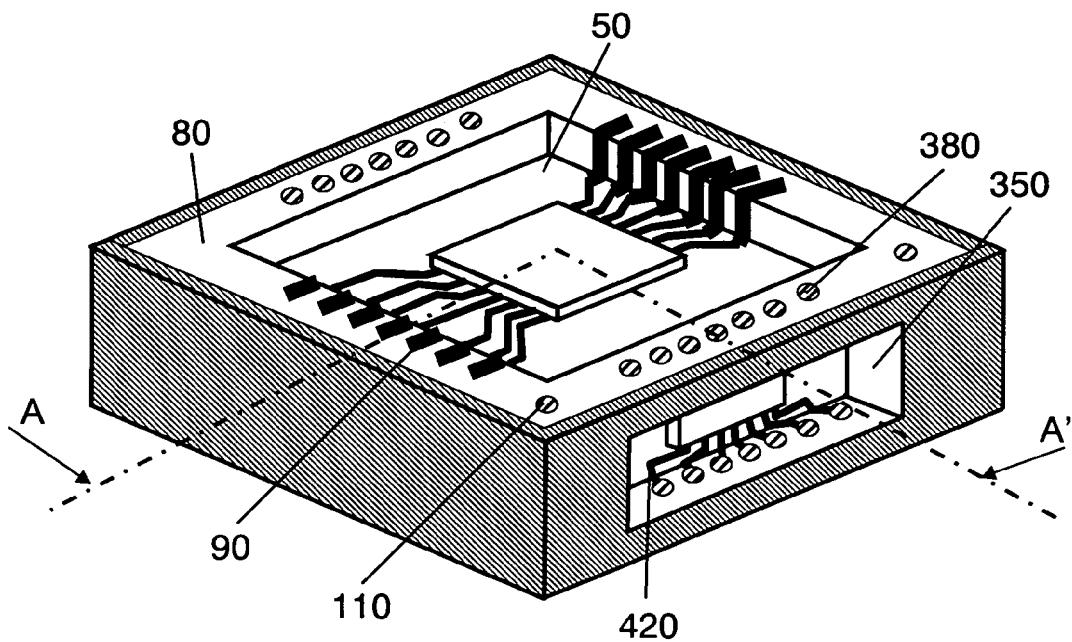
FIG. 15B is a perspective view of a relay board of the first modified example of the stereoscopic electronic circuit device according to the fourth embodiment of the present invention.

FIGS. 15A and 15B show the structure of a stereoscopic electronic circuit device according to a first modified example of the fourth embodiment of the present invention.

FIG. 15A is a cross sectional view of the stereoscopic electronic circuit device taken along the line A-A' of FIG. 15B. FIG. 15B is a perspective view of a relay board of FIG. 15A before a recess is resin-shielded using molding resin.

As shown in FIG. 15A, in the direction towards opposing surfaces 80 of relay board 370, via holes 430 are formed so as to connect between lead-out wirings 420 extending from electronic component 360 and land parts 380 formed on opposing surfaces 80 of relay board 370, and other via holes 430 are formed to connect between board connection lands 110 for connecting between first circuit board 20 and second circuit board 30. Later, recess 350 of relay board 370 shown in FIG. 15B is filled with molding resin 190. After the surface of molding resin 190 is smoothed, the outer surface of relay board 370 including the smoothed surface is covered with third shield conductor 250.

In this structure, first shield conductor 230 of first circuit board 20, second shield conductor 240 of second circuit board 30 and third shield conductor 250 provided on the outer surface of relay board 370 can be connected with each other to shield radiation noise coming from an external electronic device or going out of the stereoscopic electronic circuit device.

Figure 16A:
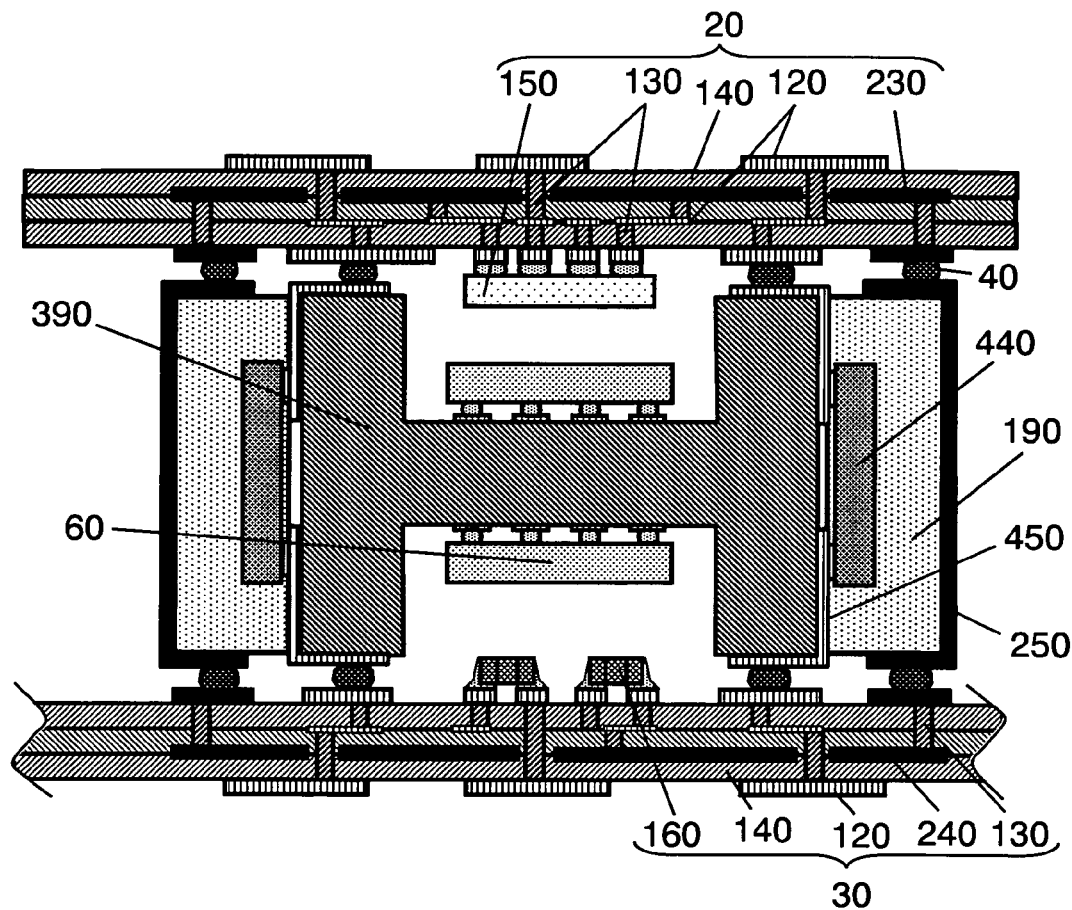
FIG. 16A is a cross sectional view of a second modified example of the stereoscopic electronic circuit device according to the fourth embodiment of the present invention.
Figure 16B:
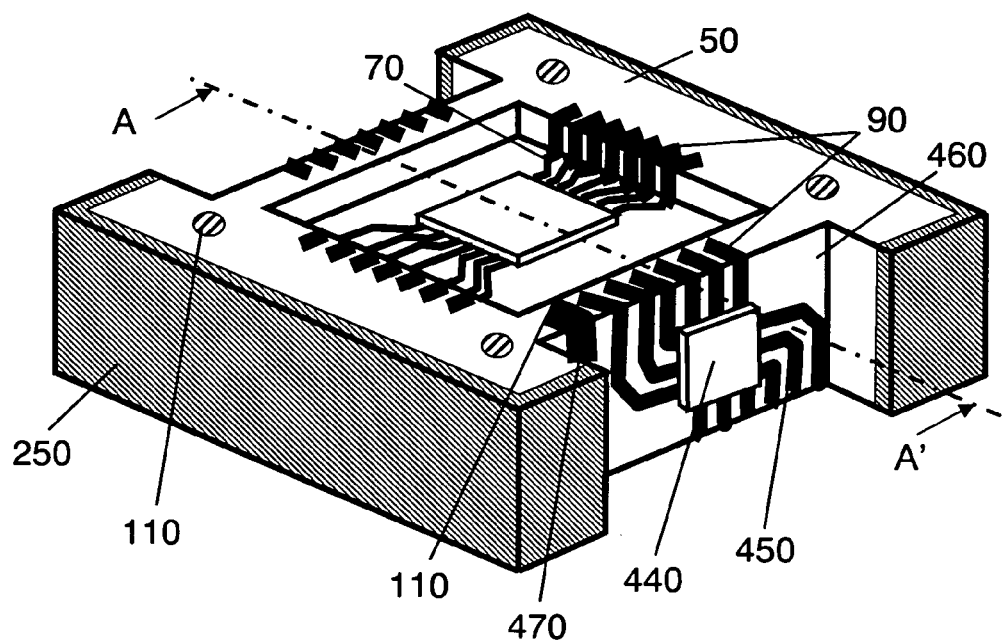
FIG. 16B is a perspective view of a relay board of the second modified example of the stereoscopic electronic circuit device according to the fourth embodiment of the present invention.

FIGS. 16A and 16B show the structure of a stereoscopic electronic circuit device according to a second modified example of the fourth embodiment of the present invention.

FIG. 16A is a cross sectional view of the stereoscopic electronic circuit device taken along the line A-A' of FIG. 16B. FIG. 16B is a perspective view of a relay board of FIG. 16A before a recess is resin-shielded using molding resin.

As shown in FIG. 16B, lead-out wirings 450 extending from electronic components 440, and board interconnections 470 for connecting between first circuit board 20 and second circuit board 30 are formed in recesses 460, and are connected with land parts 90 or board connection lands 110 formed on opposing surfaces 80. Later, recesses 460 of relay board 390 shown in FIG. 16B are filled with molding resin 190. After the surface of molding resin 190 is made to conform to the shape of opposing surfaces 80 of relay board 390, the outer surface of relay board 390 is covered with third shield conductor 250.

First circuit board 20 and second circuit board 30 may be connected with each other through via holes (not illustrated) of relay board 390 without using board interconnections 470, or may be connected through both board interconnections 470 and the via holes.

This structure allows recesses 460 to be mounted with electronic components 440 whose length is nearly equal to the height of relay board 390.

Figure 17A:
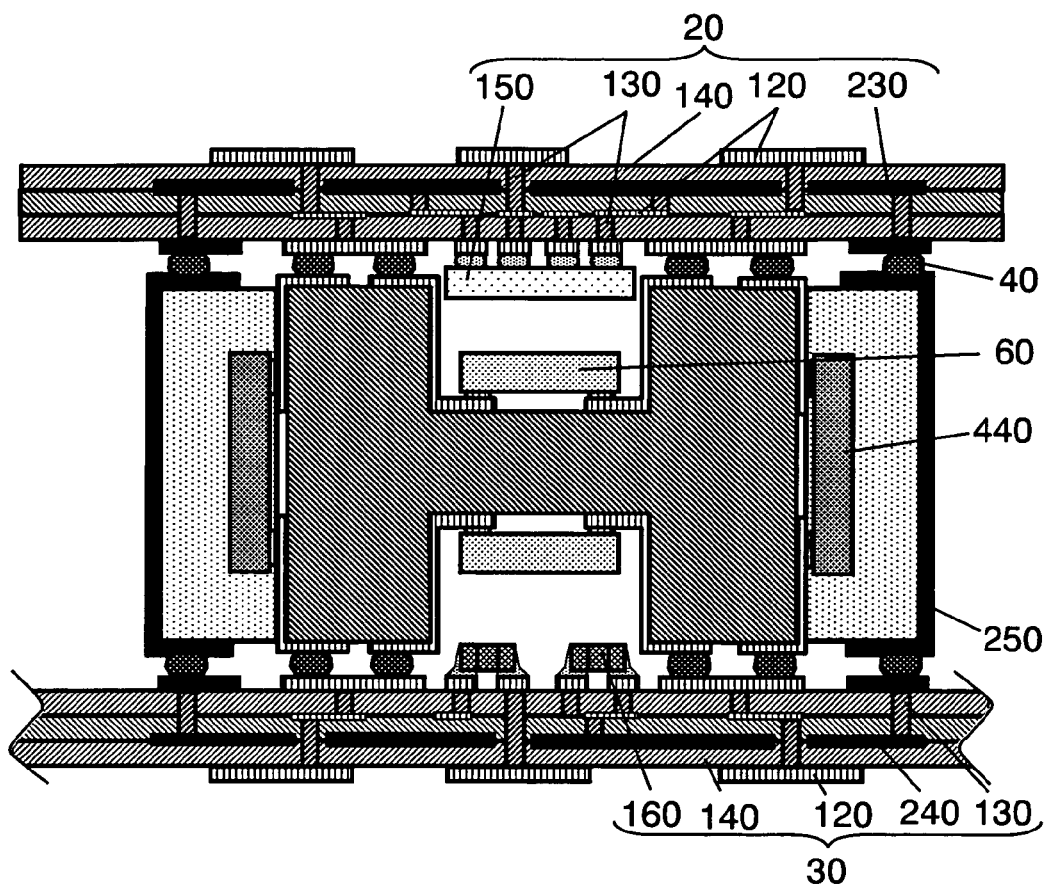
FIG. 17A is a cross sectional view of a third modified example of the stereoscopic electronic circuit device according to the fourth embodiment of the present invention.
Figure 17B:
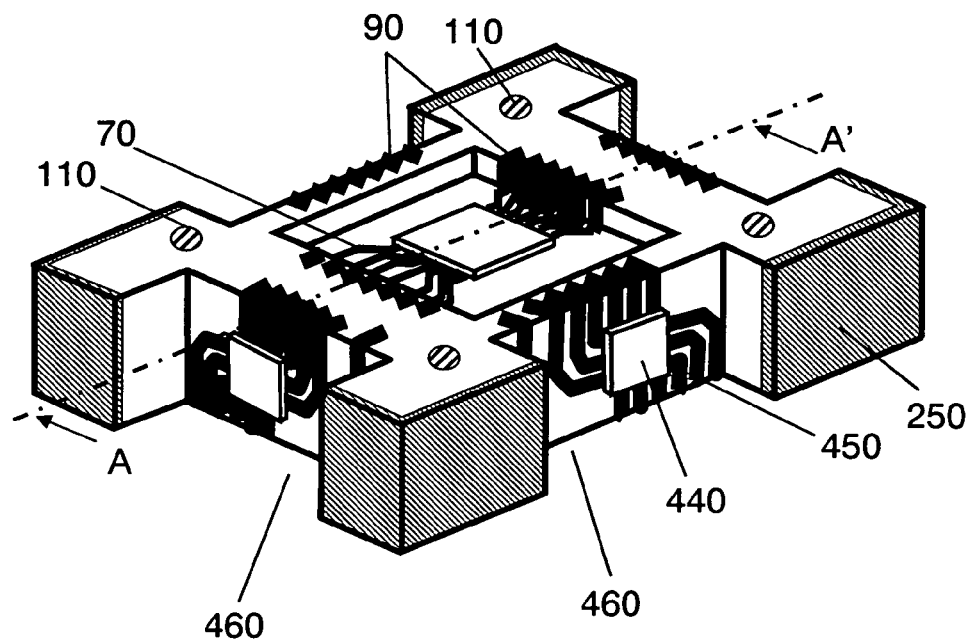
FIG. 17B is a perspective view of a relay board of the third modified example of the stereoscopic electronic circuit device according to the fourth embodiment of the present invention.

FIGS. 17A and 17B show the structure of a stereoscopic electronic circuit device according to a third modified example of the fourth embodiment of the present invention.

As shown in FIGS. 17A and 17B, relay board 13 is provided, on all its outer side surfaces except for opposing surfaces 80, with recesses 460 extending to opposing surfaces 80 so as to mount electronic components 440 thereon. This structure can further improve mounting density.

Fifth Embodiment

Figure 18A:
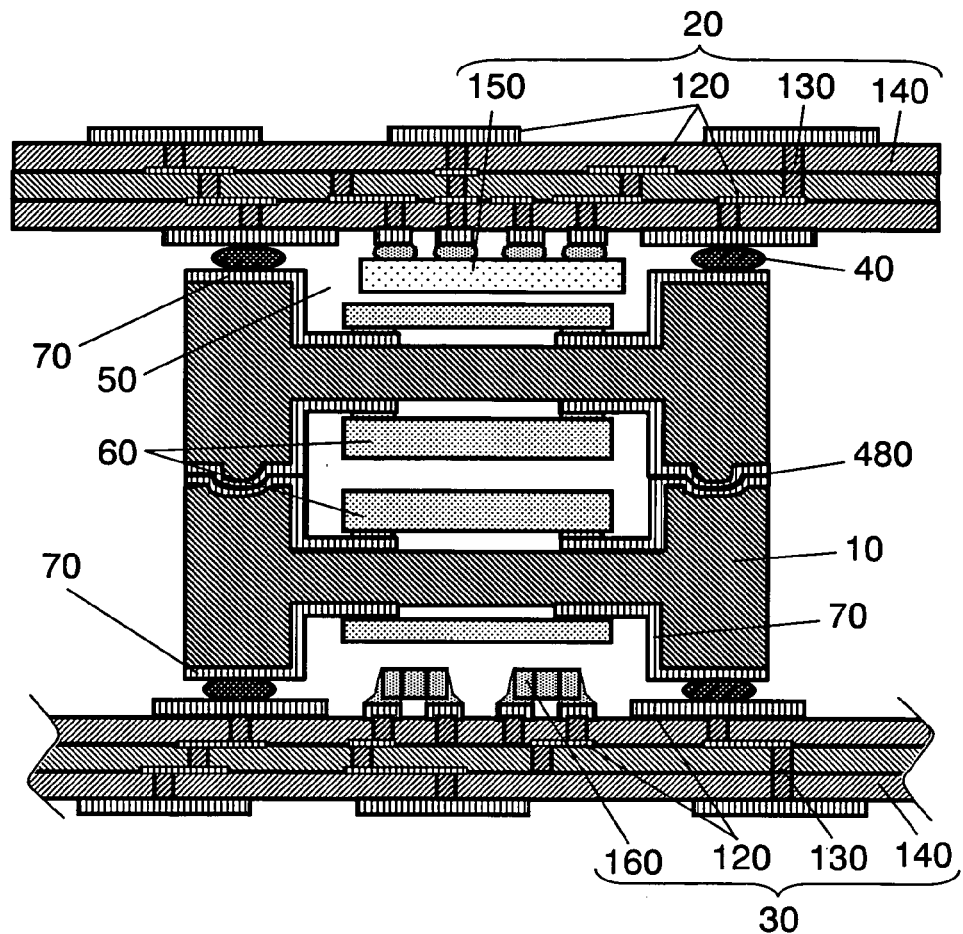
FIG. 18A is a cross sectional view of a stereoscopic electronic circuit device according to a fifth embodiment of the present invention.
Figure 18B:
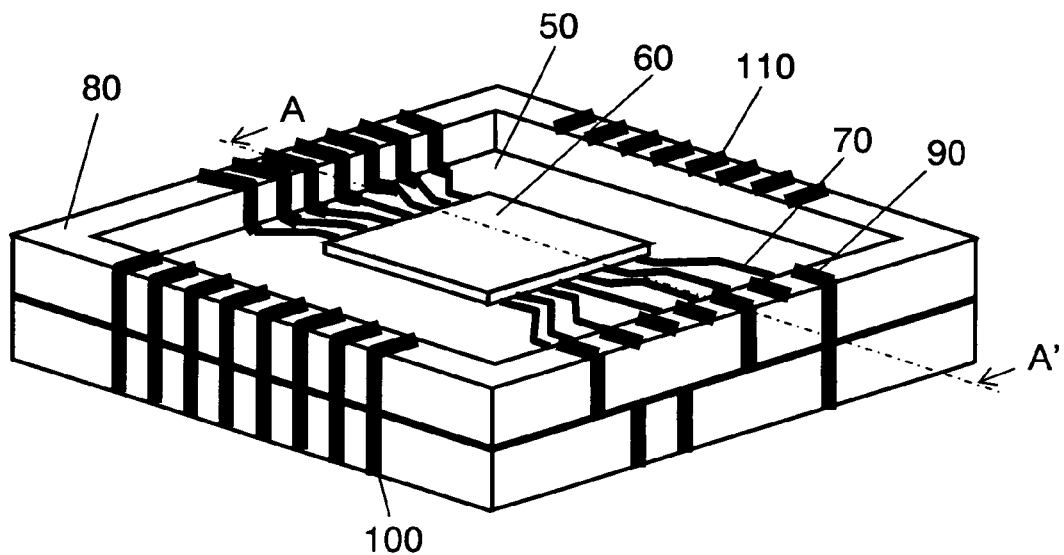
FIG. 18B is a perspective view of a relay board of the stereoscopic electronic circuit device according to the fifth embodiment of the present invention.

FIGS. 18A and 18B show the structure of a stereoscopic electronic circuit device according to a fifth embodiment of the present invention. FIG. 18A is a cross sectional view taken along the line A-A' of FIG. 18B. In the present embodiment, relay board 10 used in the first embodiment is linked with another in such a manner as to be stacked one on top of the other. Each recess 50 is mounted with electronic component 60.

Opposing surfaces 80 of each relay board 10 are provided with land parts 90 for connecting between lead-out wirings 70 extending from electronic components 60 and first circuit board 20 or second circuit board 30, and are also provided with connection terminals for connecting between relay boards 10.

FIG. 18B is a perspective view of relay boards 10 linked with each other. Each relay board 10 is provided, on opposing surfaces 80, with land parts 90 for connecting between lead-out wirings 70 extending from electronic components 60 and first circuit board 20 or second circuit board 30, and also provided with board connection lands 110 for connecting between first circuit board 20 and second circuit board 30 via board interconnections 100. As shown in FIG. 18A, connection terminals 480 are linked with each other by making one side of each of opposing surfaces 80 have unevenness and engaging the uneven sides with each other. Besides such engagement, relay boards 10 can also be solder-bonded. Alternatively, the electrodes can be bonded with pressure or with conductive resin.

In the present embodiment, two relay boards 10 are stacked one on top of the other; however, a larger number of relay boards 10 can be stacked when necessary. It is also possible to link relay boards two dimensionally or to be distanced from each other. These structures achieve more stable connection between first circuit board 20 and second circuit board 30.

With the aforementioned structure, first circuit board 20 and second circuit board 30 are connected with each other via a plurality of relay boards 10. The mounting of electronic components 60 onto recesses 50 in a multilayer can achieve higher density mounting.

Figure 19A:
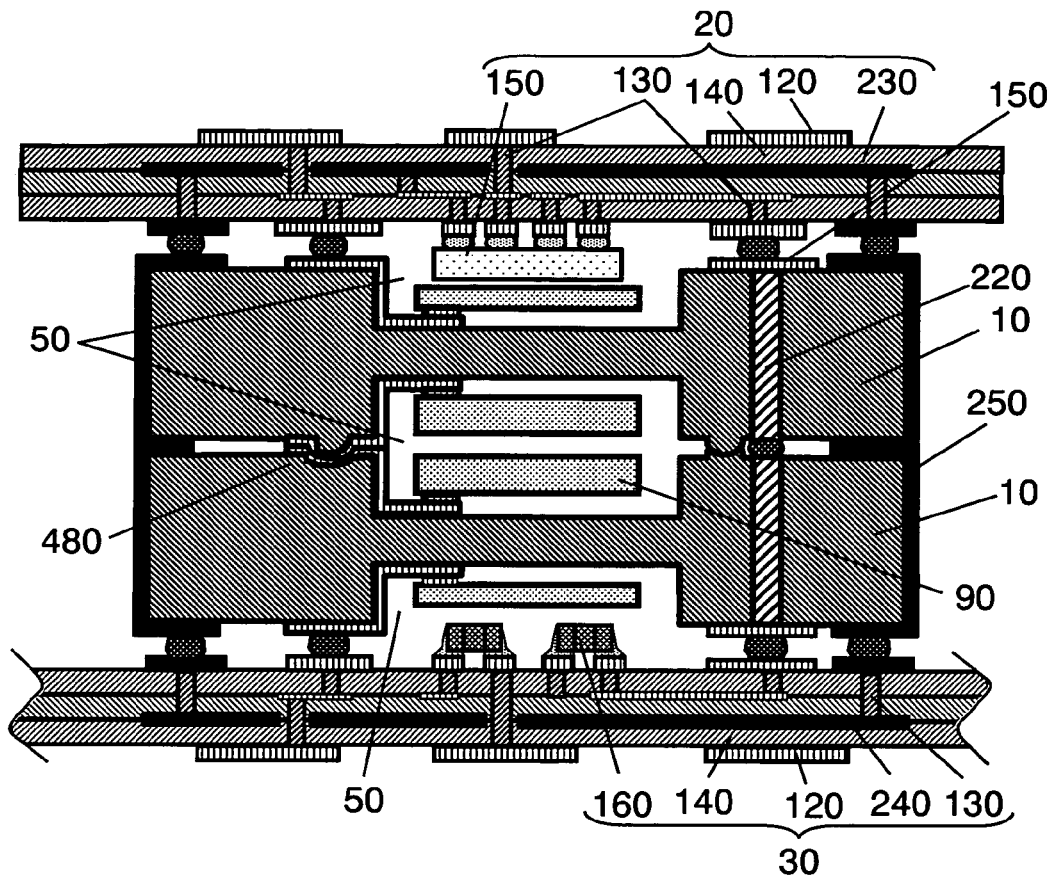
FIG. 19A is a cross sectional view of a first modified example of the stereoscopic electronic circuit device according to the fifth embodiment of the present invention.
Figure 19B:
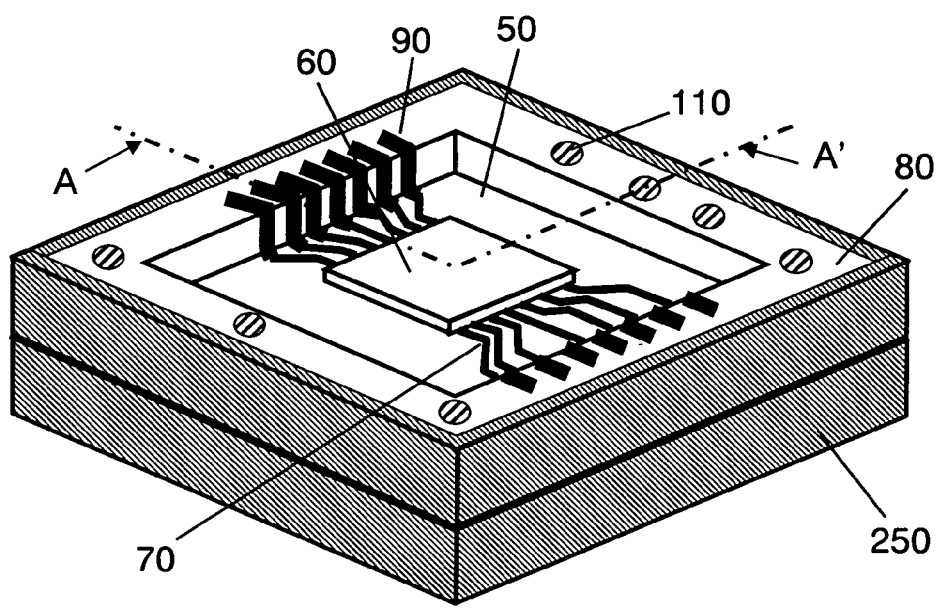
FIG. 19B is a perspective view of a relay board of the first modified example of the stereoscopic electronic circuit device according to the fifth embodiment of the present invention.

FIGS. 19A and 19B show the structure of a stereoscopic electronic circuit device according to a first modified example of the fifth embodiment of the present invention. FIG. 19A is a cross sectional view of the stereoscopic electronic circuit device taken along the line A-A' of FIG. 19B. FIG. 19B is a perspective view of relay board 10 shown in FIG. 19A. This stereoscopic electronic circuit device is achieved by providing first circuit board 20 with first shield conductor 230, second circuit board 30 with second shield conductor 240, and relay board 10 with third shield conductor 250 in the stereoscopic electronic circuit device according to the fifth embodiment.

As shown in FIG. 19B, opposing surfaces 80 or recesses 50 of relay boards 10 are provided with board connection lands 110 for connecting between first circuit board 20 and second circuit board 30 through via holes 220 penetrating in the direction towards opposing surfaces 80. Via holes 220 thus formed in relay boards 10 may be omitted when unnecessary.

With the aforementioned structure, first shield conductor 230 of first circuit board 20, second shield conductor 240 of second circuit board 30 and third shield conductor 250 provided on the outer surfaces of relay boards 10 are connected with each other to shield radiation noise coming from an external electronic device or going out of the stereoscopic electronic circuit device.

Figure 20A:
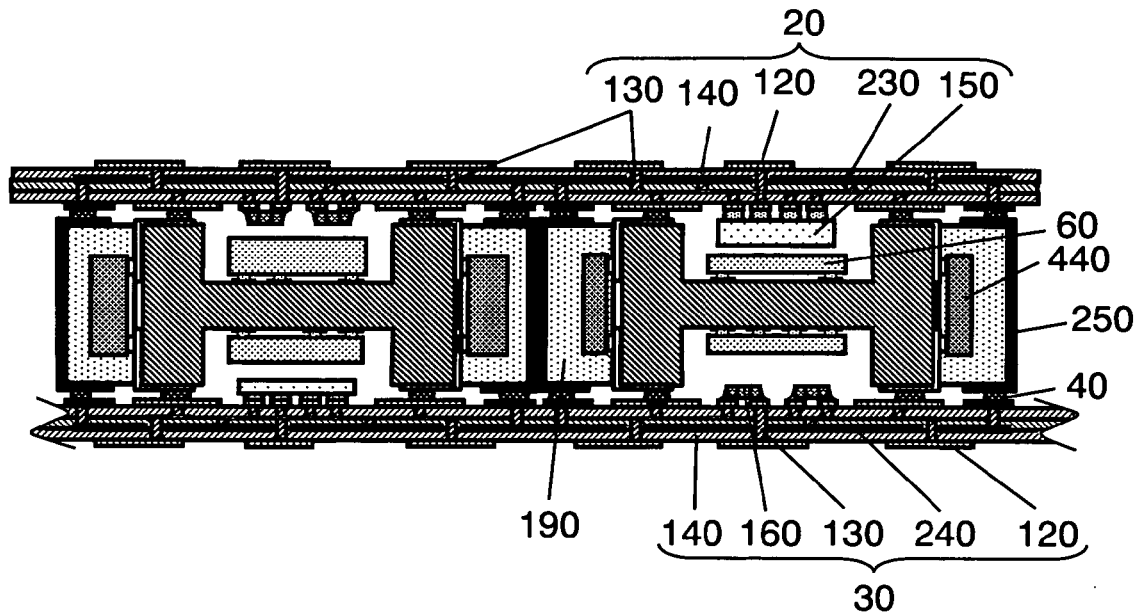
FIG. 20A is a cross sectional view of a second modified example of the stereoscopic electronic circuit device according to the fifth embodiment of the present invention.
Figure 20B:
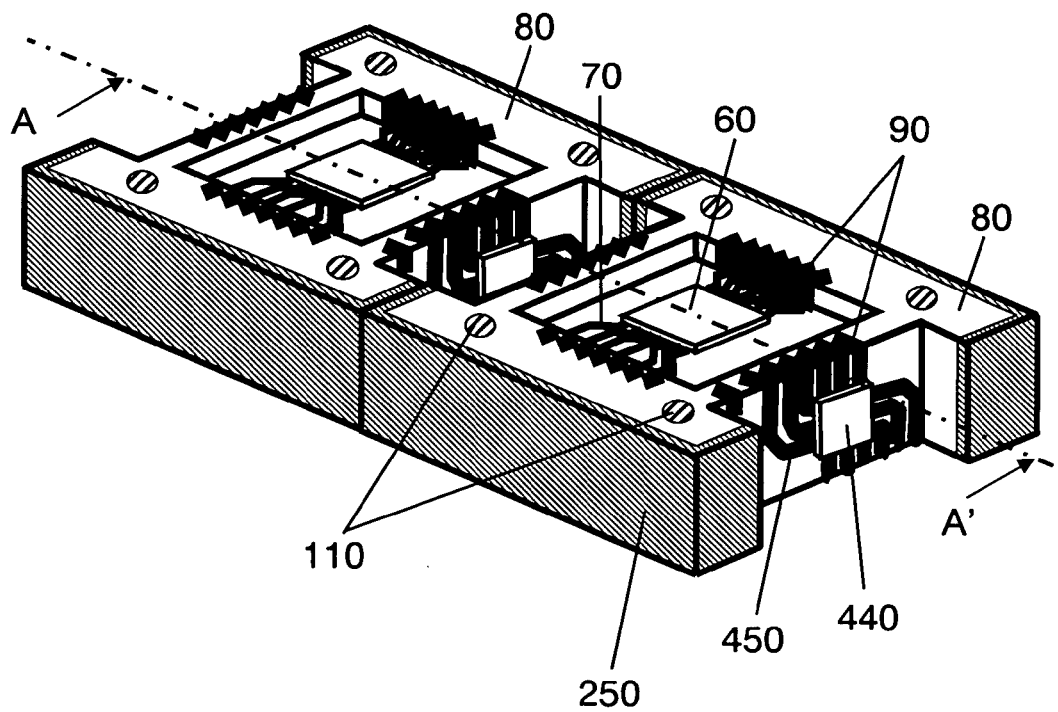
FIG. 20B is a perspective view of a relay board of the second modified example of the stereoscopic electronic circuit device according to the fifth embodiment of the present invention.

FIGS. 20A and 20B show the structure of a stereoscopic electronic circuit device according to a second modified example of the fifth embodiment of the present invention.

As shown in FIGS. 20A and 20B, the stereoscopic electronic circuit device is structured by linking a plurality of relay boards two dimensionally or distanced from each other. This structure expands the connection area (opposing surfaces 80), thereby further stabilizing the connection between first circuit board 20 and second circuit board 30.

Sixth Embodiment

Figure 21:
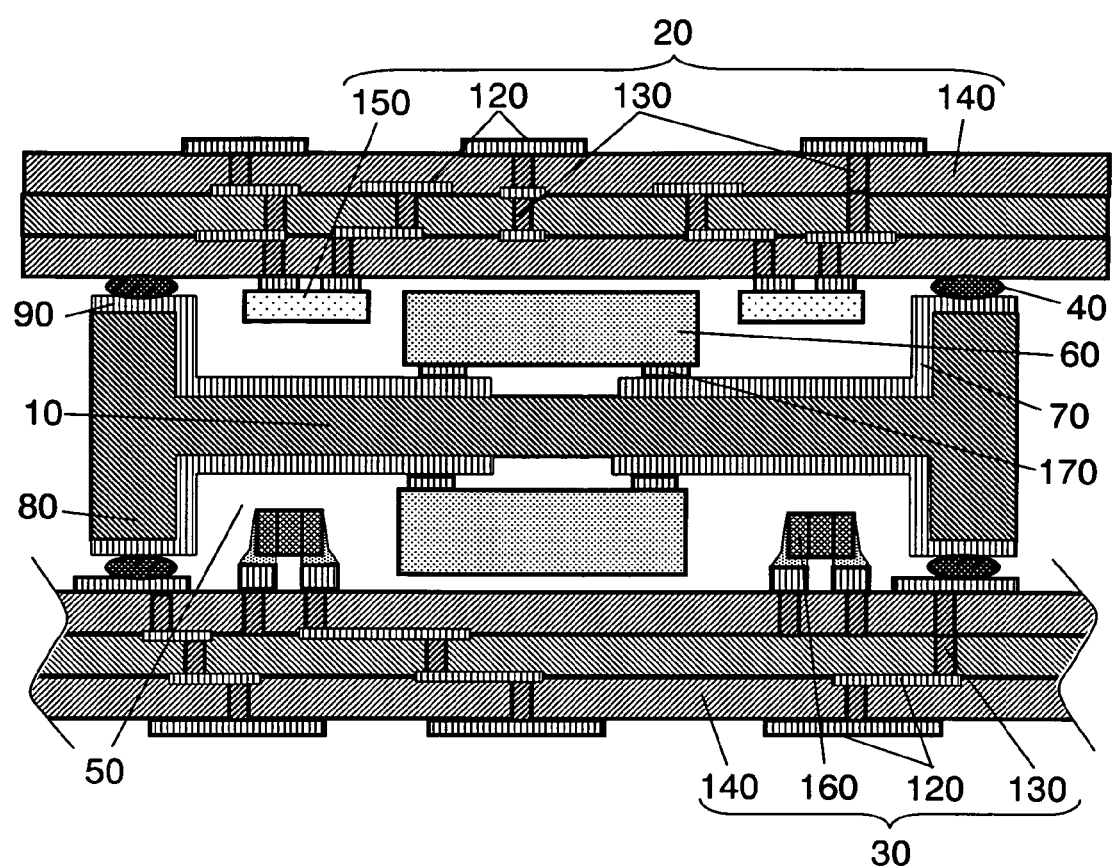
FIG. 21 is a cross sectional view of a stereoscopic electronic circuit device according to a sixth embodiment of the present invention.

FIG. 21 is a cross sectional view of a stereoscopic electronic circuit device according to a sixth embodiment of the present invention. First circuit board 20 and second circuit board 30 are connected with each other electrically and mechanically via relay board 10 disposed therebetween by using connection members 40. Recesses 50 formed on opposing surfaces 80 of relay board 10 are mounted with electronic components 60 using connection members 40. Opposing surfaces 80 are provided with land parts 90 to be connected with lead-out wirings 70 extending from electronic components 60, and also provided with board interconnections lands (not illustrated) for connecting between first circuit board 20 and second circuit board 30. Electronic components 60 mounted on recesses 50 of relay board 10, and other electronic components 150 and 160 which are mounted respectively on the surfaces of first circuit board 20 and second circuit board 30 that face opposing surfaces 80 of relay board 17 are placed so as not to be overlapped with each other when projected in the thickness or height direction.

This structure can reduce the height or thickness of the stereoscopic electronic circuit device.

In addition, connecting first circuit board 20 and second circuit board 30, and mounting electronic components 60 on relay board 10 stereoscopically can achieve the low profile of the stereoscopic electronic circuit device and high density mounting at the same time.

Figure 22A:
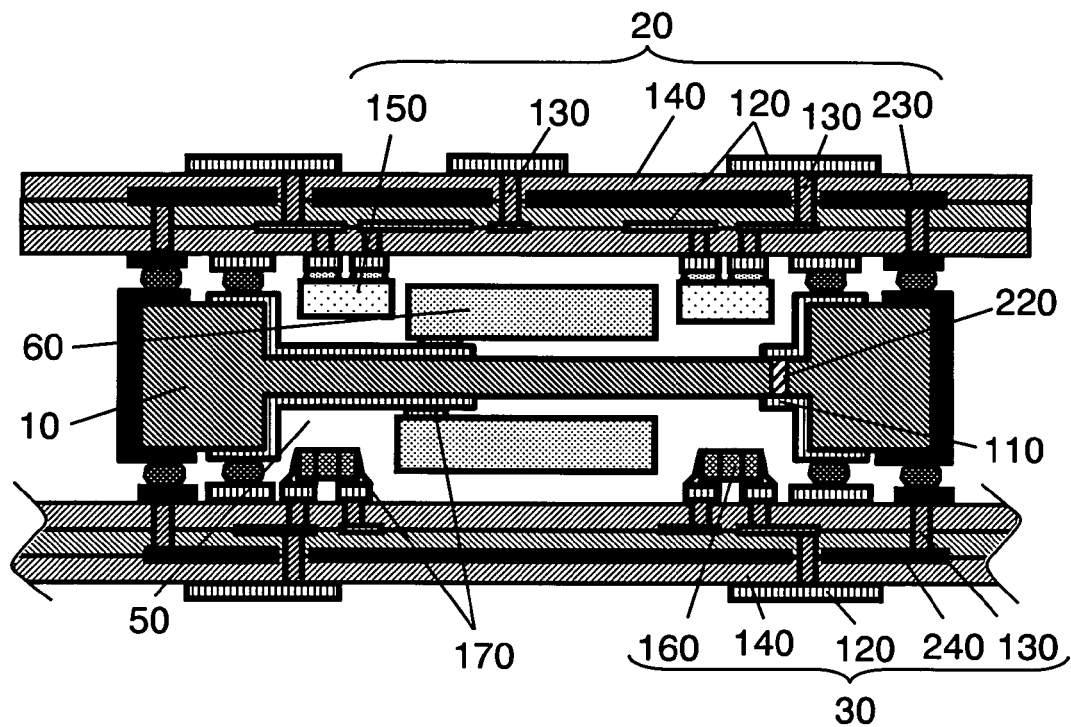
FIG. 22A is a cross sectional view of a modified example of the stereoscopic electronic circuit device according to the sixth embodiment of the present invention.
Figure 22B:
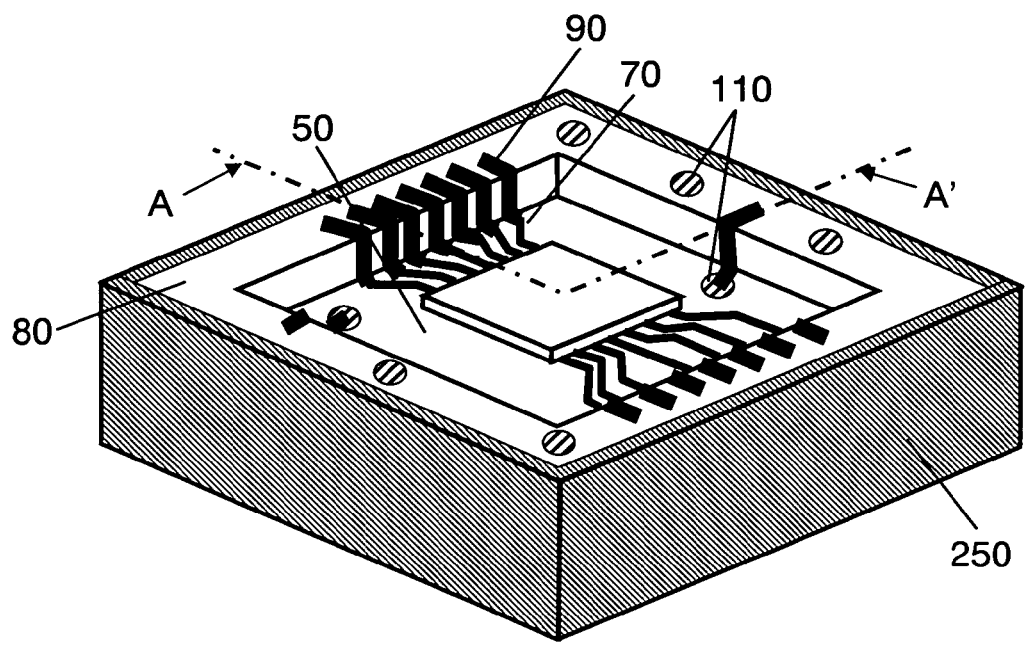
FIG. 22B is a perspective view of a relay board of the modified example of the stereoscopic electronic circuit device according to the sixth embodiment of the present invention.

FIGS. 22A and 22B show the structure of a stereoscopic electronic circuit device according to a modified example of the sixth embodiment of the present invention.

FIG. 22A is a cross sectional view of the stereoscopic electronic circuit device taken along the line A-A' of FIG. 22B. FIG. 22B is a perspective view of relay board 10 shown in FIG. 22A.

This stereoscopic electronic circuit device is achieved by providing first circuit board 20 with first shield conductor 230, second circuit board 30 with second shield conductor 240, and relay board 10 with third shield conductor 250 in the stereoscopic electronic circuit device according to the sixth embodiment.

As shown in FIG. 22A, opposing surfaces 80 of relay board 10 have electronic components 60 mounted onto recesses 50 via connection members 170, and also have land parts 90 to be connected with lead-out wirings 70 extending from electronic components 60 in the vicinity of the end parts of opposing surfaces 80. When necessary, relay board 10 can have board connection lands 110 for connecting first circuit board 20 and second circuit board 30 through via holes 220 penetrating opposing surfaces 80 or recesses 50 in the direction towards opposing surfaces 80.

With the aforementioned structure, first shield conductor 230 of first circuit board 20, second shield conductor 240 of second circuit board 30 and third shield conductor 250 provided on the outer surface of relay board 10 are connected with each other to shield radiation noise coming from an external electronic device or going out of the stereoscopic electronic circuit device.

Seventh Embodiment

Figure 23:
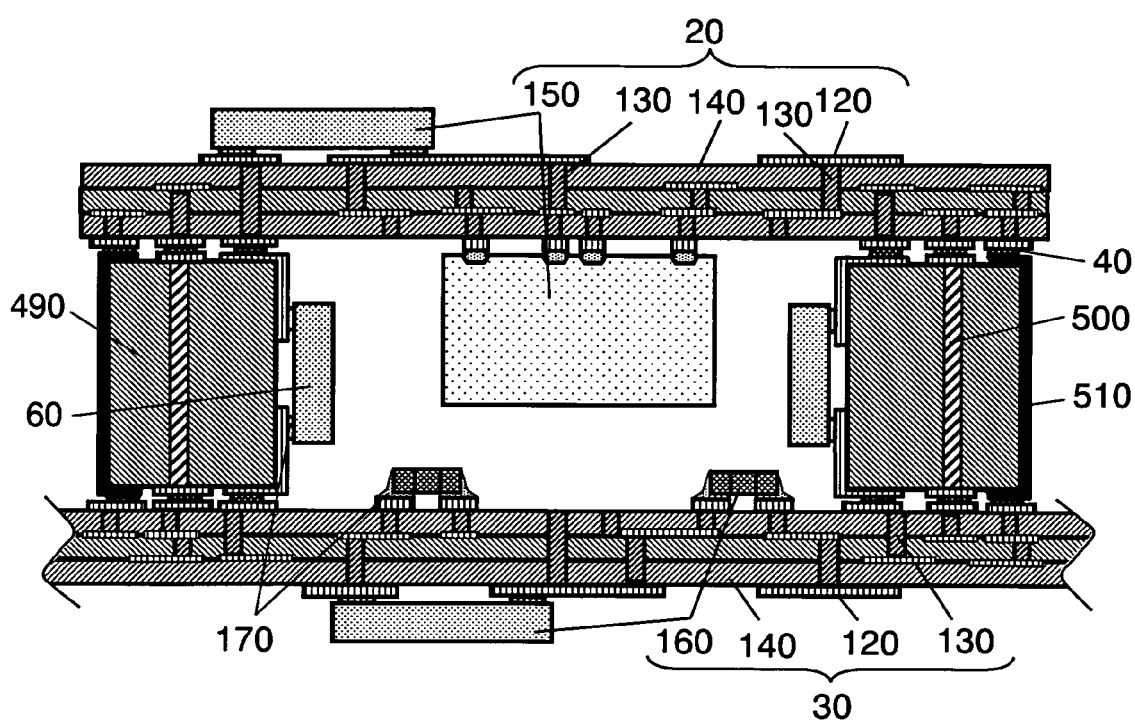
FIG. 23 is a cross sectional view of a stereoscopic electronic circuit device according to a seventh embodiment of the present invention.

FIG. 23 is a cross sectional view of a stereoscopic electronic circuit device according to a seventh embodiment of the present invention.

This stereoscopic electronic circuit device has a structure in which first circuit board 20 and second circuit board 30 are connected with each other electrically and mechanically via relay frame 490 disposed therebetween by using connection members 40.

Relay frame 490 has via holes 500 for connecting between first circuit board 20 and second circuit board 30. The inner surface of relay frame 490 is mounted with chip electronic components 60, and the outer surface is covered with conductive shield layer 510 for noise prevention. The electrodes of first circuit board 20 and the electrodes of second circuit board 30 are connected with each other electrically and mechanically through connection members 40, and via holes 500.

The electrodes of electronic components 60 mounted on the inner surface of relay frame 490 are connected with the electrodes of first circuit board 20 or second circuit board 30 at the land parts (not illustrated) connected with lead-out wirings (not illustrated) via connection members 40.

The height of relay frame 490 is designed to be larger than the sum of the height of other electronic components 150 and 160 mounted on the surfaces of first circuit board 20 and second circuit board 30 that face the opposing surfaces of relay frame 490 (hereinafter referred to as opposing surfaces 80) and the height of connection members 170.

In this structure, relay frame 490 not only functions as a spacer but also improves mounting density by mounting electronic components 60 on its inner surfaces. Furthermore, other electronic components 150 and 160 respectively mounted on first circuit board 20 and second circuit board 30 can be connected with electronic components 60 mounted on relay frame 490 in the shortest distance so as to improve the high-frequency properties of the stereoscopic electronic circuit device, thereby achieving high-speed operation of the electronic device.

Figure 24A:
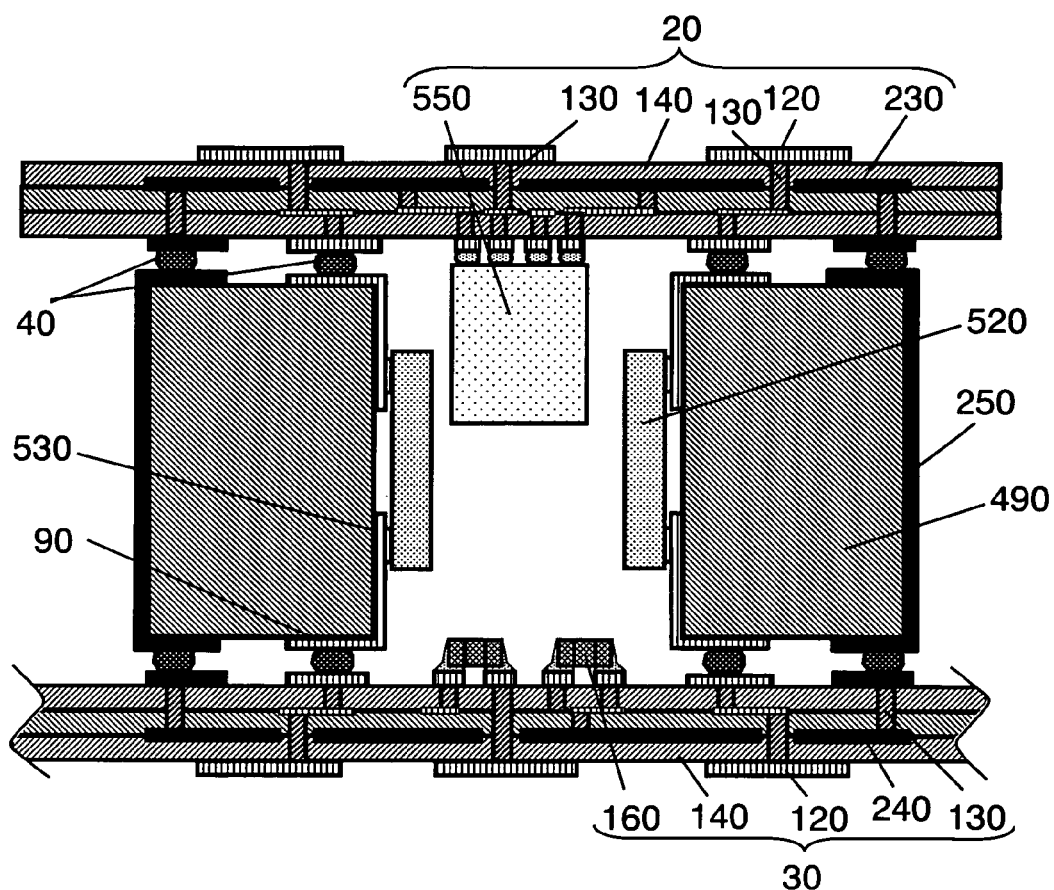
FIG. 24A is a cross sectional view of a first modified example of the stereoscopic electronic circuit device according to the seventh embodiment of the present invention.
Figure 24B:
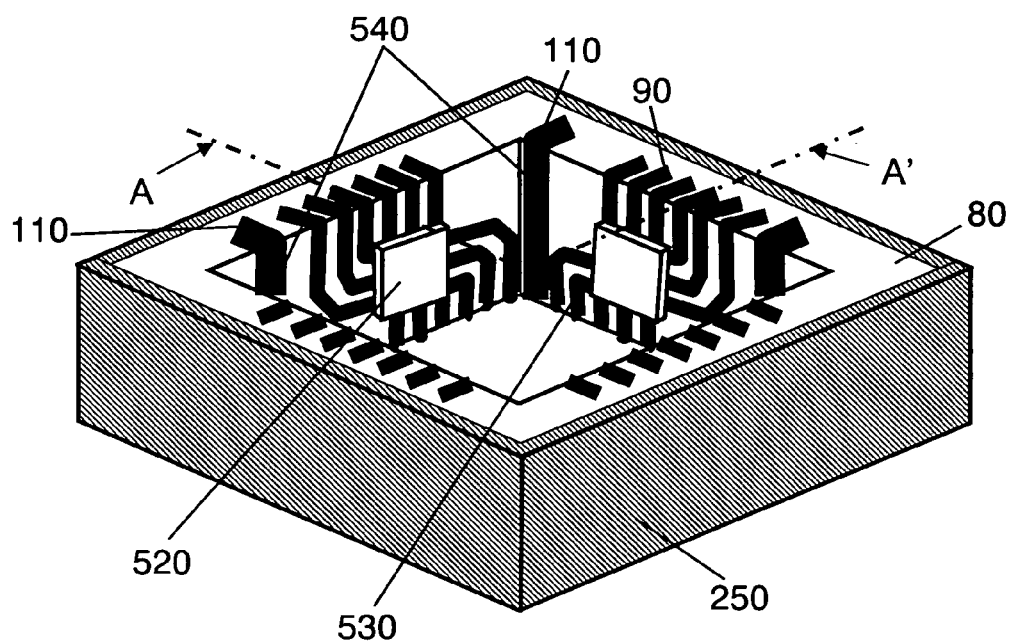
FIG. 24B is a perspective view of a relay board of the first modified example of the stereoscopic electronic circuit device according to the seventh embodiment of the present invention.

FIGS. 24A and 24B show the structure of a stereoscopic electronic circuit device according to a first modified example of the seventh embodiment of the present invention.

FIG. 24A is a cross sectional view of the stereoscopic electronic circuit device taken along the line A-A' of FIG. 24B. FIG. 24B is a perspective view of relay frame 490 shown in FIG. 24A.

This stereoscopic electronic circuit device is achieved by connecting between first circuit board 20 provided with first shield conductor 230 and second circuit board 30 provided with second shield conductor 240 electrically and mechanically via relay frame 490 provided with third shield conductor 250 and disposed therebetween by using connection members 40 in the stereoscopic electronic circuit device according to the seventh embodiment.

As shown in FIG. 24A, the inner surface of relay frame 490 is mounted with electronic components 520, and is provided with lead-out wirings 530 extending from electronic components 520, and board interconnections 540 for connecting between first circuit board 20 and second circuit boards 30. Opposing surfaces 80 of relay frame 490 that face first circuit board 20 or second circuit board 30 are provided with land parts 90 connected to lead-out wirings 530, and board connection lands 110 connected to board interconnections 540. Consequently, first circuit board 20, second circuit board 30 and electronic components 520 are electrically connected with each other via connection members 40. When necessary, it is possible to connect board connection lands 110 with first circuit board 20 and second circuit board 30 through via holes (not illustrated) penetrating opposing surfaces 80 of relay frame 490.

This structure can reduce the projected area of the stereoscopic electronic circuit device since electronic components 520 can be disposed vertically. In addition, when other electronic component 550 with a large height is mounted on first circuit board 20 or second circuit board 30, it is unnecessary to increase the height of relay frame 490. Furthermore, it is possible to mount electronic components 520 having a height nearly equal to the height of relay frame 490, indicating the effective mounting of a large-sized electronic component.

Figure 25A:
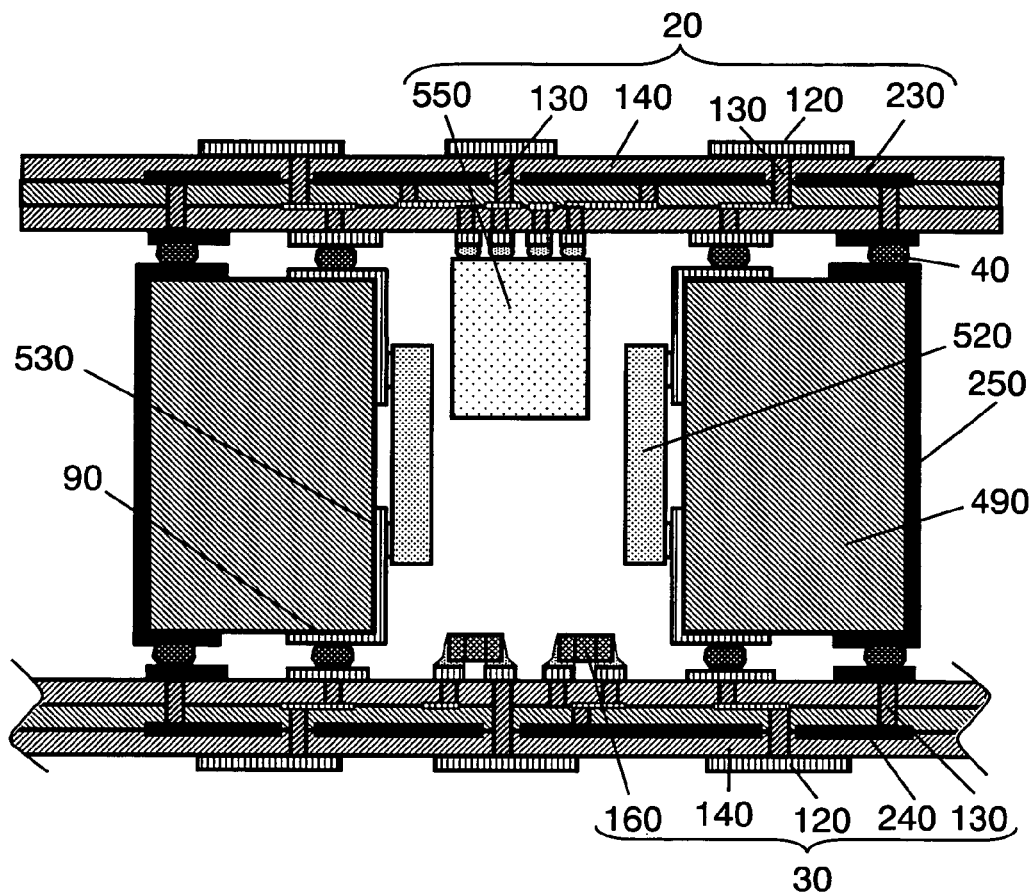
FIG. 25A is a cross sectional view of a second modified example of the stereoscopic electronic circuit device according to the seventh embodiment of the present invention.
Figure 25B:
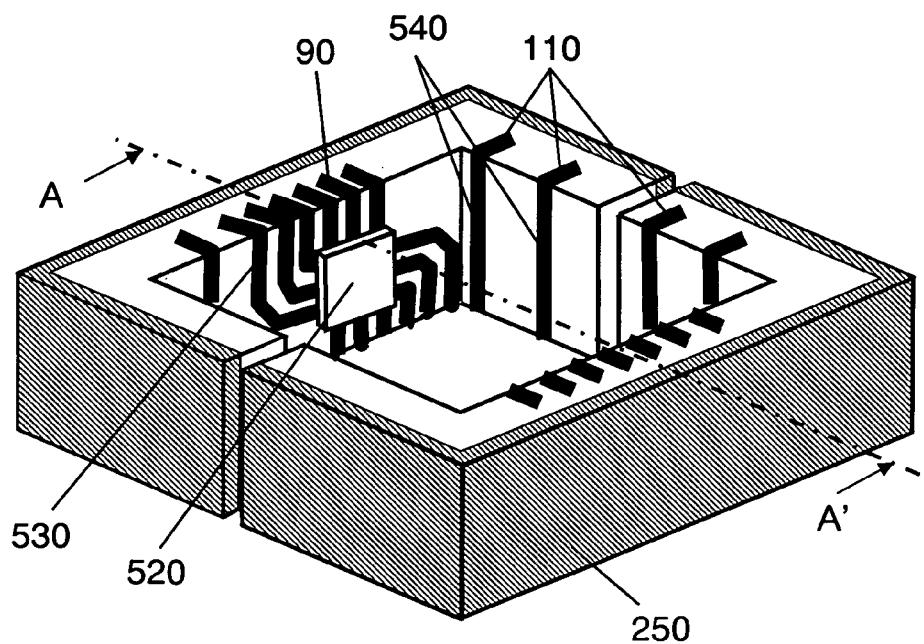
FIG. 25B is a perspective view of a relay board of the second modified example of the stereoscopic electronic circuit device according to the seventh embodiment of the present invention.

FIGS. 25A and 25B show the structure of a stereoscopic electronic circuit device according to a second modified example of the seventh embodiment of the present invention.

As shown in FIG. 25B, it is also possible to assemble the stereoscopic electronic circuit device shown in FIG. 25A by dividing relay frame 490 at least into two parts, and then mounting electronic components 520.

This structure facilitates the mounting of electronic components 520 onto the inner surface of relay frame 490, and the formation of lead-out wirings 530.

Figure 26A:
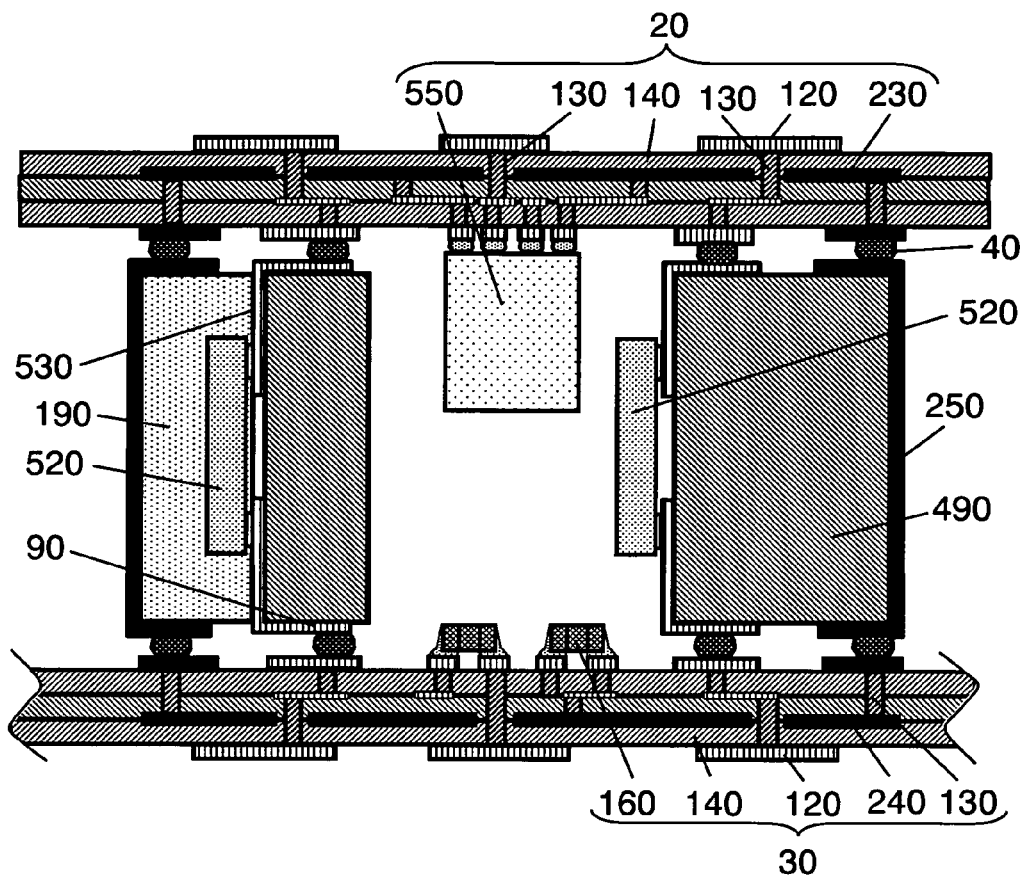
FIG. 26A is a cross sectional view of a third modified example of the stereoscopic electronic circuit device according to the seventh embodiment of the present invention.
Figure 26B:
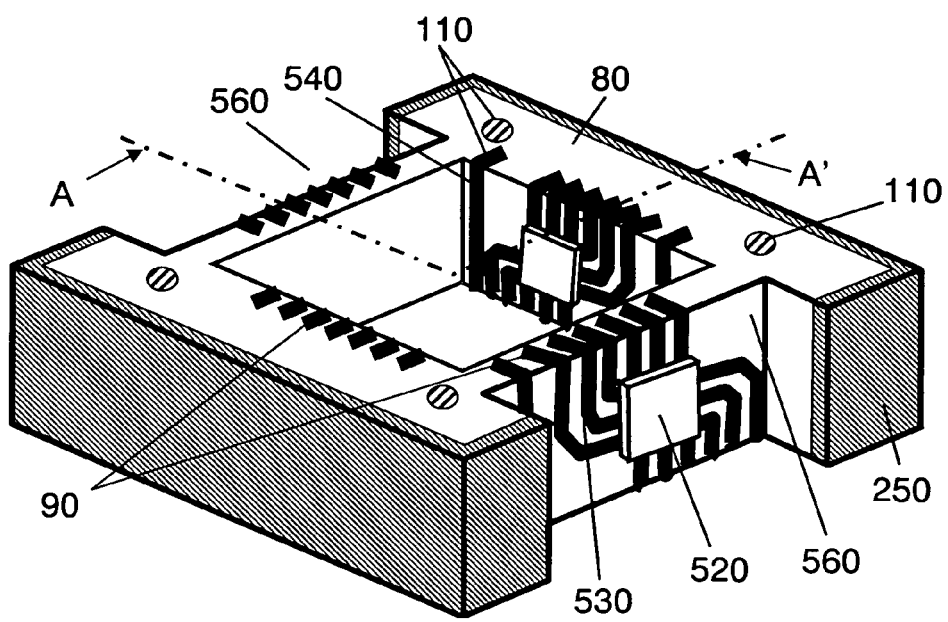
FIG. 26B is a perspective view of a relay board of the third modified example of the stereoscopic electronic circuit device according to the seventh embodiment of the present invention.

FIGS. 26A and 26B show the structure of a stereoscopic electronic circuit device according to a third modified example of the seventh embodiment of the present invention.

As shown in FIGS. 26A and 26B, recesses 560 are formed on the outer surfaces of relay frame 490 in such a manner as to extend to opposing surfaces 80, and electronic components 520 are mounted on recesses 560. Later, recesses 560 are molded using molding resin 190, and then third shield conductor 250 is formed, thereby completing the stereoscopic electronic circuit device. This structure can achieve higher density mounting.

Figure 27:
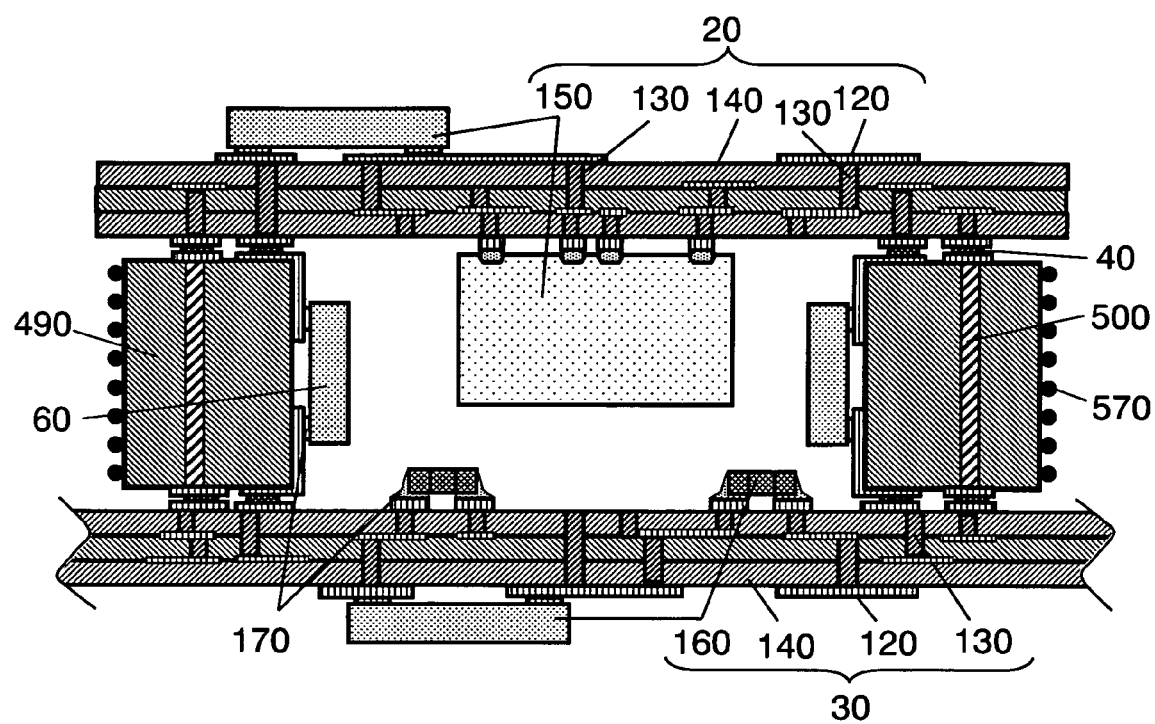
FIG. 27 is a cross sectional view of a fourth modified example of the stereoscopic electronic circuit device according to the seventh embodiment of the present invention.

FIG. 27 shows the structure of a stereoscopic electronic circuit device according to a fourth modified example of the seventh embodiment of the present invention.

As shown in FIG. 27, this stereoscopic electronic circuit device is achieved by providing the stereoscopic electronic circuit device according to the seventh embodiment with inductors or loop antennas made by helixes on the outer surface of relay frame 490. In general, the formation of inductors or loop antennas requires large space. To overcome this problem, relay frame 490 is utilized as a bobbin for wound inductors or loop antennas so as to miniaturize the stereoscopic electronic circuit device.

The helixes can be replaced by inductors or loop antennas 570 made by forming a metal film on a side surface of relay frame 490, and then patterning the film into a coil.

The aforementioned structure enables the stereoscopic electronic circuit device to be mounted with IC chips for transmitting and receiving information by radio, that is, IC tags.

It is also possible to make relay frame 490 from resin capable of injection molding so as to facilitate the formation of bar-like trenches for helixes on the outer surface.

Eighth Embodiment

Figure 28A:
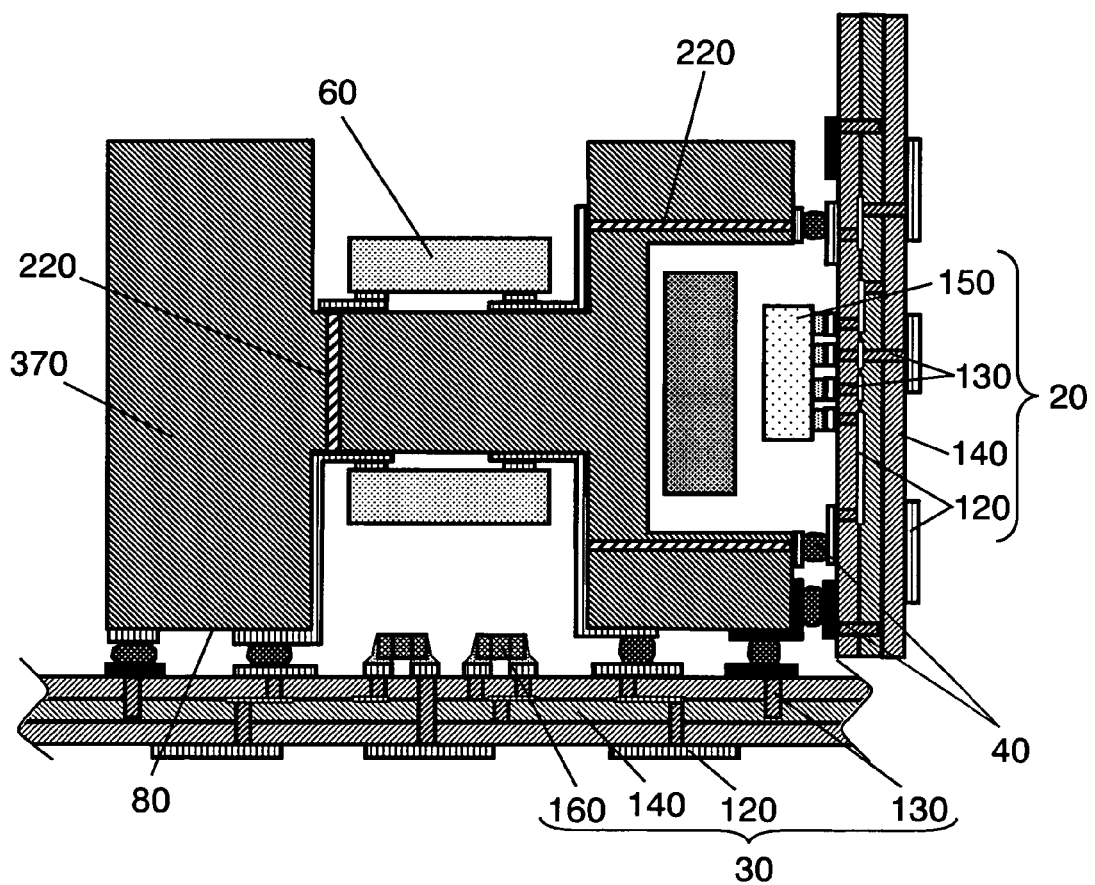
FIG. 28A is a cross sectional view of a stereoscopic electronic circuit device according to an eighth embodiment of the present invention.
Figure 28B:
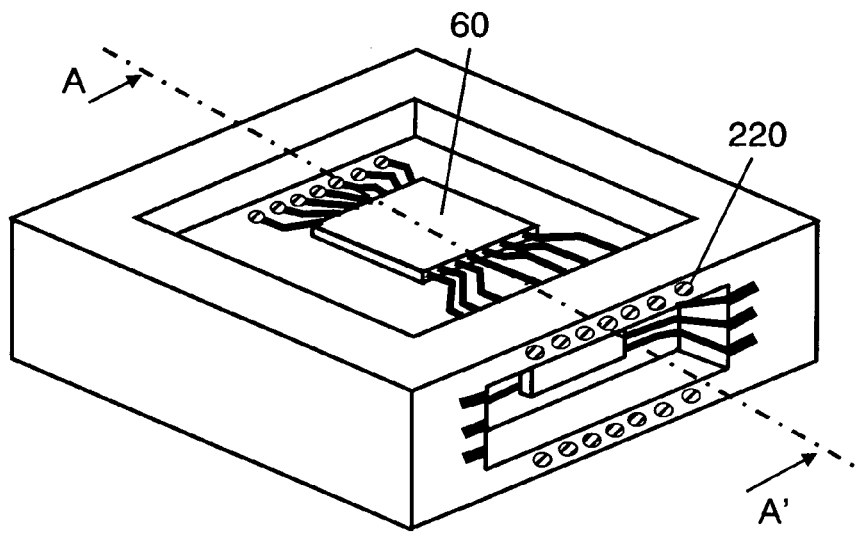
FIG. 28B is a perspective view of a relay board of the stereoscopic electronic circuit device according to the eighth embodiment of the present invention.

FIGS. 28A and 28B show the structure of a stereoscopic electronic circuit device according to an eighth embodiment of the present invention.

FIG. 28A is a cross sectional view of the stereoscopic electronic circuit device taken along the line A-A' of FIG. 28B. FIG. 28B is a perspective view of relay board 370 shown in FIG. 28A.

The stereoscopic electronic circuit device has a structure in which first circuit board 20 and second circuit board 30 are disposed, e.g. in the shape of a letter L, and relayed by relay board 370. This structure allows first circuit board 20 and second circuit board 30 to be connected with each other electrically and mechanically in an arbitrary direction.

Figure 29A:
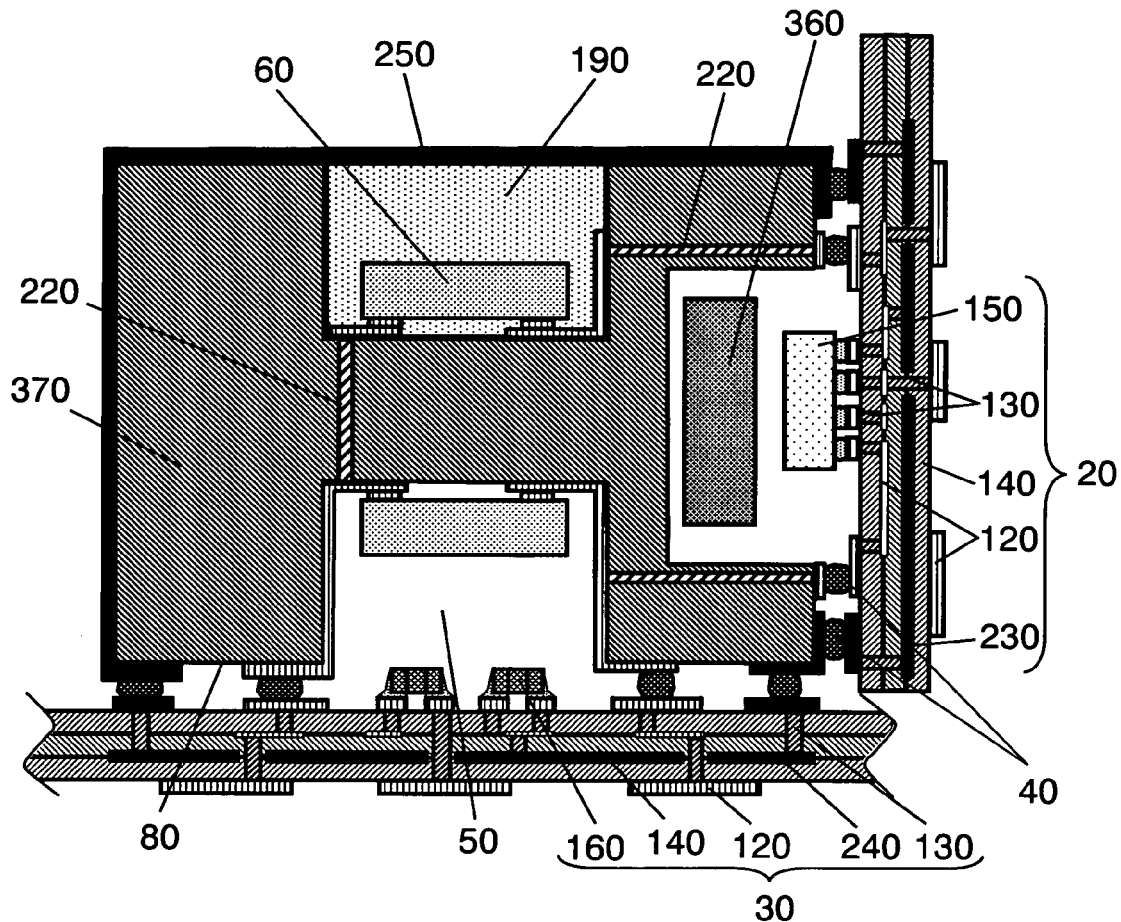
FIG. 29A is a perspective view of a modified example of the stereoscopic electronic circuit device according to the eighth embodiment of the present invention.
Figure 29B:
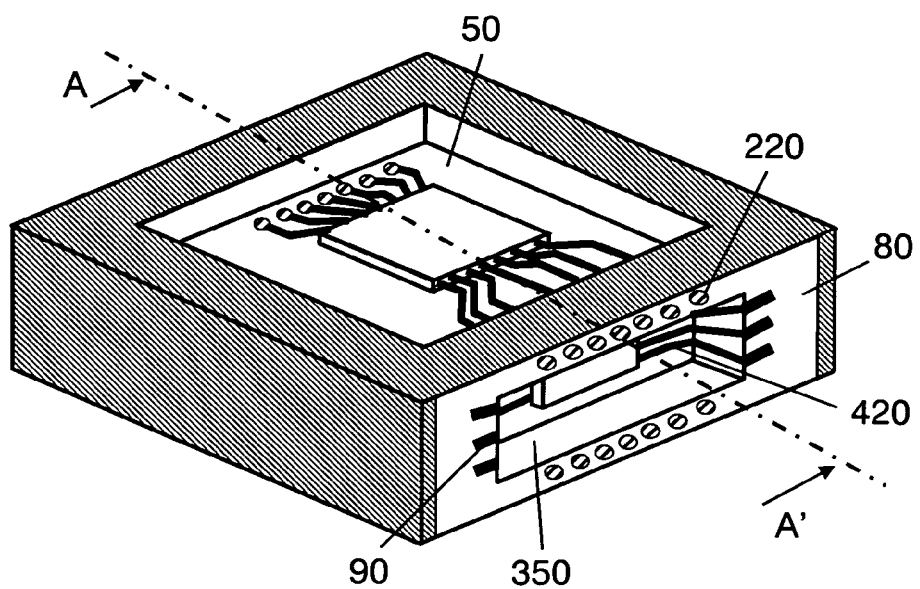
FIG. 29B is a perspective view of a relay board of the modified example of the stereoscopic electronic circuit device according to the eighth embodiment of the present invention.
Figure 30:
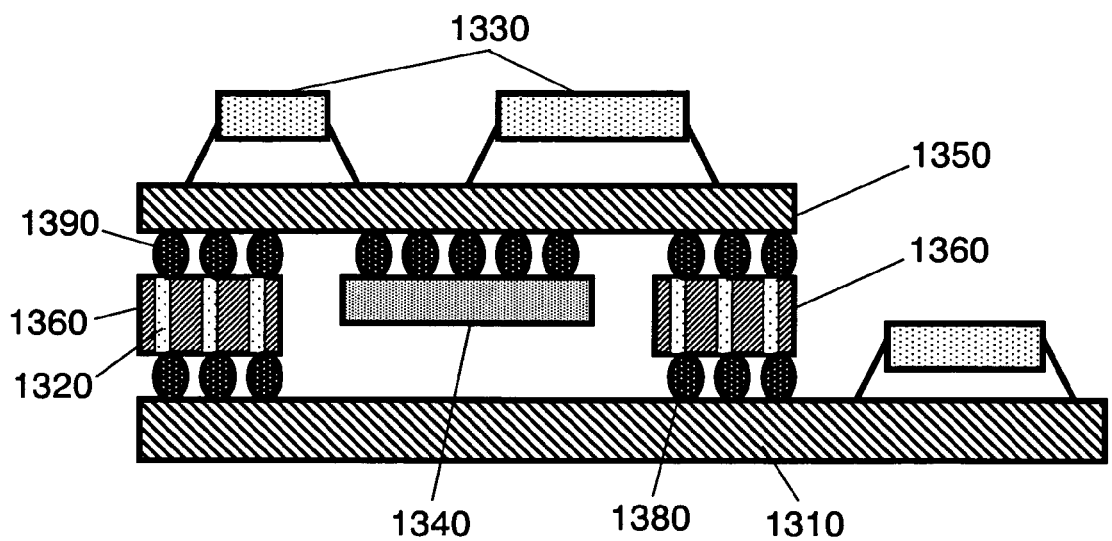
FIG. 30 is a cross sectional view of a conventional electronic circuit device.
Figure 31:
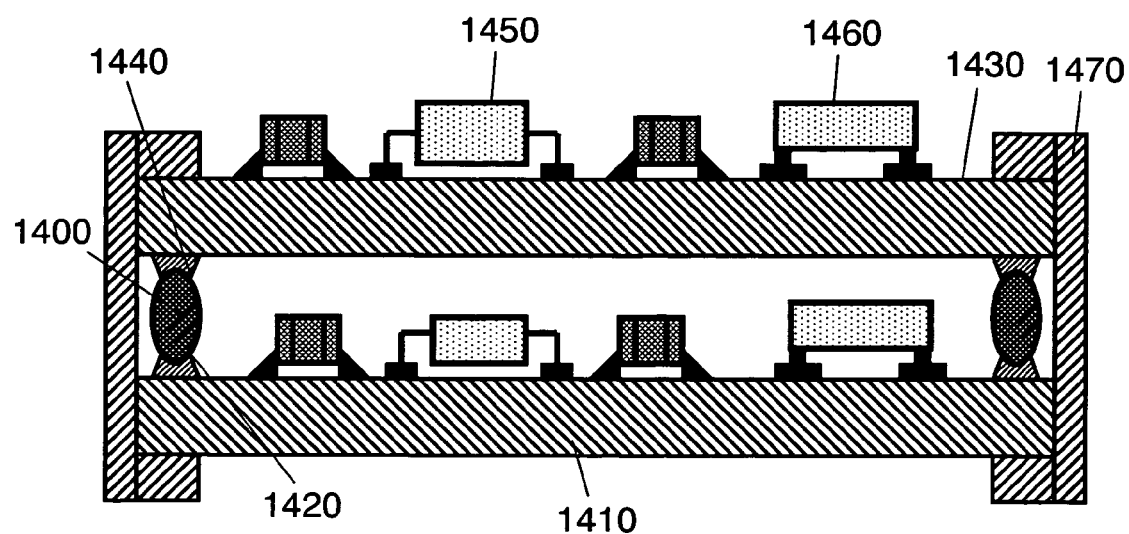
FIG. 31 is a cross sectional view of another conventional electronic circuit device.
Figure 32:
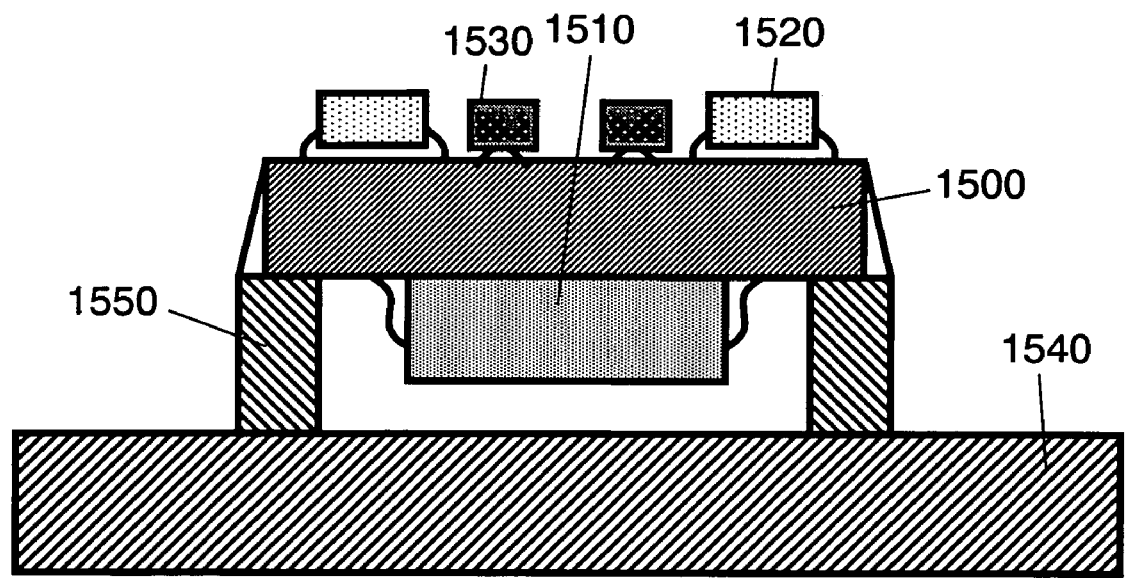
FIG. 32 is a cross sectional view of further another conventional electronic circuit device.

FIGS. 29A and 29B show the structure of a stereoscopic electronic circuit device according to a modified example of the eighth embodiment of the present invention. FIG. 29A is a cross sectional view of the stereoscopic electronic circuit device taken along the line A-A' of FIG. 29B. FIG. 29B is a perspective view of relay board 370 shown in FIG. 29A.

This stereoscopic electronic circuit device is achieved by providing first circuit board 20 with first shield conductor 230, second circuit board 30 with second shield conductor 240, and relay board 370 with third shield conductor 250 in the stereoscopic electronic circuit device according to the eighth embodiment. Third shield conductor 250 of relay board 370 is formed after recess 50, which is formed at least on a surface other than opposing surfaces 80 that face first circuit board 20 or second circuit board 30, is molded by using molding resin 190.

This structure allows first circuit board 20 and second circuit board 30 to be connected with each other in an arbitrary direction, and also provides a high shielding effect against electromagnetic waves.

It goes without saying that the aforementioned structure can be applied to a relay frame.

In the description in each of the aforementioned embodiments of the present invention, third shield conductor 250 on the outer surface of the relay board or the relay frame is extended to part of opposing surfaces 80 that face first circuit board 20 or second circuit board 30, thereby being connected with first circuit board 20 or second circuit board 30 there. However, when the connection with first circuit board 20 or second circuit board 30 is secured, third shield conductor 250 can be formed exclusively on the outer surface of the relay board or the relay frame, without causing any problem.

What is claimed is:

1. A stereoscopic electronic circuit device, comprising:
   a first circuit board;
   a second circuit board;
   a relay board provided between the first circuit board and the second circuit board, wherein
   the relay board has a recess which is mounted with an electronic component and is provided with a lead-out wiring extending from the electronic component, and also has a land part for connecting the lead-out wiring with one of the first circuit board and the second circuit board on one of surfaces that face the first circuit board and the second circuit board;
   the first circuit board and the second circuit board are connected with each other three-dimensionally via the land part of the relay board, and
   at least a portion of an electrical component of at least one of the first or second circuit board is disposed within the recess of the relay board.

2. The stereoscopic electronic circuit device according to claim 1, wherein
   at least one of the first circuit board and the second circuit board is mounted with an other electronic component.

3. The stereoscopic electronic circuit device according to claim 1, wherein
   the recess of the relay board is formed on at least one of surfaces that face the first circuit board and the second circuit board, and the recess is mounted with the electronic component.

4. The stereoscopic electronic circuit device according to claim 1, wherein
   the recess of the relay board is formed on a surface other than the surfaces that face the first circuit board and the second circuit board, and the recess is mounted with the electronic component.

5. The stereoscopic electronic circuit device according to claim 1, wherein
   the recess of the relay board is formed on at least part of the surfaces that face the first circuit board and the second circuit board, and on at least part of a surface other than the surfaces that face the first circuit board and the second circuit board, and the electronic component is mounted on the recess.

6. The stereoscopic electronic circuit device according to claim 1, wherein
   the recess of the rely board is mounted with a plurality of electronic components.

7. The stereoscopic electronic circuit device according to claim 1, wherein
   an outer surface of the relay board has a shield electrode formed thereon.

8. The stereoscopic electronic circuit device according to claim 1, wherein
   the first circuit board has a first shield conductor thereon, the second circuit board has a second shield conductor thereon, and the relay board has a third shield conductor on an outer surface thereof, and
   the first shield conductor, the second shield conductor and the third shield conductor are connected with each other.

9. The stereoscopic electronic circuit device according to claim 1, wherein
   the electronic component mounted on the recess of the relay board is resin-shield using molding resin.

10. The stereoscopic electronic circuit device according to claim 2, wherein
    the electronic component mounted on the recess, and the other electronic component mounted on one of the first circuit board and the second circuit board are placed so as not to be overlapped with each other.

11. The stereoscopic electronic circuit device according to claim 1, wherein
    the relay board has an inductor or a loop antenna on a side surface thereof.

12. The stereoscopic electronic circuit device according to claim 1, wherein
    a plurality of relay boards are linked with each other so that the first circuit board and the second circuit board are connected with each other three-dimensionally.

13. The stereoscopic electronic circuit device according to claim 1, wherein
    the relay board has a board interconnection on a side surface thereof, and also has a board connection land to be connected with the board interconnection on the surfaces that face the first circuit board and the second circuit board.

14. The stereoscopic electronic circuit device according to claim 13, wherein
    the board interconnection is made up of a via hole penetrating the surfaces of the relay board that face the first circuit board and the second circuit board.

15. The stereoscopic electronic circuit device according to claim 1, wherein
    at least one of the first circuit board and the second circuit board is a flexible circuit board.

16. A relay board, comprising:
    a recess mounted with an electronic component and provided with a lead-out wiring extending from the electronic component; and
    a land part for being connected with the lead-out wiring to be connected with an other circuit board on a surface of the relay board that faces the other circuit board,
    wherein at least a portion of an electrical component of the other circuit board is disposed within the recess of the relay board.

17. The relay board according to claim 16, wherein
the recess of the relay board is formed on at least one surface that faces the other circuit board, and the recess is mounted with the electronic component.

18. The relay board according to claim 16, wherein
the recess of the relay board is formed on a surface other than the surface that faces the other circuit board, and the recess is mounted with the electronic component.

19. The relay board according to claim 16, wherein
the recess of the relay board is formed on at least part of the surface that faces the other circuit board, and at least part of a surface other than the surface that faces the other circuit board, and the electronic component is mounted on the recess.

20. The relay board according to claim 16, wherein
the recess of the rely board is mounted with a plurality of electronic components.

21. The relay board according to claim 16, wherein
a side surface of the relay board has one of a shield electrode and a third shield conductor formed thereon.

22. The relay board according to claim 16, wherein
the recess is resin-shield with molding resin.

23. The relay board according to claim 16, wherein
the relay board has a board interconnection on a side surface thereof, and also has a board connection land to be connected with the board interconnection on the surface of the relay board that faces the other circuit board.

24. The relay board according to claim 23, wherein
the board interconnection is made up of a via hole penetrating the surface of the relay board that faces the other circuit board.

25. The stereoscopic electronic circuit device according to claim 1, wherein the relay board includes:
an outer portion extending substantially orthogonal to and between the first and second circuit boards, and
a center portion extending substantially parallel to the first and second circuit boards,
wherein the recess which is mounted with the electronic component is on a first side of the center portion, and
another recess is mounted with another electrical component on a second side, opposite the first side.

* * * * *

UNITED STATES PATENT AND TRADEMARK OFFICE
CERTIFICATE OF CORRECTION

PATENT NO.        : 7,613,010 B2                                          Page 1 of 1
APPLICATION NO.   : 10/985325
DATED             : November 3, 2009
INVENTOR(S)       : Masahiro Ono et al.

It is certified that error appears in the above-identified patent and that said Letters Patent is hereby corrected as shown below:

<u>Column 18</u>

In claim 6, line 3, "rely" should read -- relay --.

<u>Column 19</u>

In claim 20, line 2, "rely" should read -- relay --.

Signed and Sealed this

Twenty-eighth Day of December, 2010

David J. Kappos
*Director of the United States Patent and Trademark Office*